(12) United States Patent
Brauchler et al.

(10) Patent No.: US 9,362,987 B2
(45) Date of Patent: *Jun. 7, 2016

(54) METHODS OF MANUFACTURING AND OPERATING DIE-TO-DIE INDUCTIVE COMMUNICATION DEVICES

(71) Applicant: FREESCALE SEMICONDUCTOR, INC., Austin, TX (US)

(72) Inventors: Fred T. Brauchler, Canton, MI (US); Randall C. Gray, Tempe, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/812,242

(22) Filed: Jul. 29, 2015

(65) Prior Publication Data

US 2015/0333805 A1    Nov. 19, 2015

Related U.S. Application Data

(62) Division of application No. 14/104,355, filed on Dec. 12, 2013, now Pat. No. 9,100,063.

(51) Int. Cl.
*H01L 27/08* (2006.01)
*H04B 5/00* (2006.01)
(Continued)

(52) U.S. Cl.
CPC ............ *H04B 5/0081* (2013.01); *H01L 21/486* (2013.01); *H01L 21/4857* (2013.01); *H01L 21/565* (2013.01); *H01L 23/49531* (2013.01); *H01L 23/49541* (2013.01);
(Continued)

(58) Field of Classification Search
CPC ............ H01L 29/7393; H01L 29/7395; H01L 29/7398
See application file for complete search history.

(56) References Cited

U.S. PATENT DOCUMENTS 4,780,795 A    10/1988  Meinel
6,054,780 A     4/2000  Haigh et al.
(Continued)

FOREIGN PATENT DOCUMENTS

EP     2509106 A1    10/2012
WO  2010137090 A1    12/2010

OTHER PUBLICATIONS

European Search Report mailed 29 Oct. 2014, for EP 14173336, 7 pages.

(Continued)

*Primary Examiner* — Elias M Ullah
(74) *Attorney, Agent, or Firm* — Sherry W. Schumm

(57) ABSTRACT

Embodiments of inductive communication devices include first and second IC die and an inductive coupling substrate. The first IC die has a first coil. The inductive coupling substrate has a second coil and a first signal communication interface (e.g., a third coil or a contact). The second IC die has a second signal communication interface (e.g., a fourth coil or a contact). The first IC die and the inductive coupling substrate are arranged so that the first and second coils are aligned across a gap between the first IC die and the inductive coupling substrate. A dielectric component is positioned within the gap between the first and second coils to galvanically isolate the first IC die and the inductive coupling substrate. During operation, signals are conveyed between the first and second IC die through inductive coupling between the coils and communication through the signal communication interfaces.

18 Claims, 16 Drawing Sheets

(51) Int. Cl.

| | | |
|---|---|---|
| *H01L 25/065* | (2006.01) | |
| *H01L 25/00* | (2006.01) | |
| *H01L 23/00* | (2006.01) | |
| *H01L 23/495* | (2006.01) | |
| *H01L 29/739* | (2006.01) | |
| *H01L 23/64* | (2006.01) | |
| *H01L 21/48* | (2006.01) | |
| *H01L 21/56* | (2006.01) | |
| *H01L 23/498* | (2006.01) | |
| *H01L 23/522* | (2006.01) | |
| *H01L 23/31* | (2006.01) | |

(52) U.S. Cl.
CPC ... *H01L 23/49575* (2013.01); *H01L 23/49822* (2013.01); *H01L 23/5227* (2013.01); *H01L 23/564* (2013.01); *H01L 23/645* (2013.01); *H01L 24/49* (2013.01); *H01L 24/85* (2013.01); *H01L 25/0655* (2013.01); *H01L 25/50* (2013.01); *H01L 29/7393* (2013.01); *H01L 29/7395* (2013.01); *H01L 23/3107* (2013.01); *H01L 2224/16145* (2013.01); *H01L 2224/48091* (2013.01); *H01L 2224/48101* (2013.01); *H01L 2224/48177* (2013.01); *H01L 2224/48464* (2013.01); *H01L 2224/49* (2013.01); *H01L 2224/85801* (2013.01); *H01L 2924/00014* (2013.01); *H01L 2924/06* (2013.01); *H01L 2924/07025* (2013.01); *H01L 2924/1206* (2013.01); *H01L 2924/13055* (2013.01); *H01L 2924/14* (2013.01); *H01L 2924/2064* (2013.01); *H01L 2924/20641* (2013.01); *H01L 2924/20642* (2013.01); *H01L 2924/20643* (2013.01); *H01L 2924/20644* (2013.01); *H04B 5/0031* (2013.01); *H04B 5/0075* (2013.01)

(56) References Cited

U.S. PATENT DOCUMENTS

| | | | |
|---|---|---|---|
| 6,873,065 | B2 | 3/2005 | Haigh et al. |
| 7,112,457 | B2 | 9/2006 | Kek et al. |
| 7,582,960 | B2 | 9/2009 | Karnezos |
| 7,692,444 | B2 | 4/2010 | Chen et al. |
| 7,709,944 | B2 | 5/2010 | Kuan et al. |
| 8,203,214 | B2 | 6/2012 | Bathan et al. |
| 8,237,534 | B2 | 8/2012 | Fouquet et al. |
| 8,427,844 | B2 | 4/2013 | Ho et al. |
| 8,571,360 | B2 | 10/2013 | Tay et al. |
| 8,592,944 | B2 | 11/2013 | Santangelo et al. |
| 8,674,800 | B2 | 3/2014 | Willkofer et al. |
| 2010/0328902 | A1 | 12/2010 | Ho et al. |
| 2011/0001587 | A1 | 1/2011 | Sutardja |
| 2011/0049693 | A1 | 3/2011 | Nakashiba et al. |
| 2011/0176339 | A1 | 7/2011 | Kerber et al. |
| 2014/0070420 | A1 | 3/2014 | Sapone |

OTHER PUBLICATIONS

Non-Final Rejection mailed Jul. 22, 2015 for U.S. Appl. No. 13/930,250, 22 pages.
Notice of Allowance mailed May 22, 2015 for U.S. Appl. No. 14/104,355, 11 pages.
Notice of Allowance mailed Jul. 22, 2015 for U.S. Appl. No. 14/573,674, 9 pages.
Avago Technologies, "ACPL-M71U and ACPL-M72U, Wide Operating Temperature, High Speed, Low Power Digital Optocouples with R2Coupler Isolation," Data Sheet, www.avagotech.com; Oct. 2, 2012, pp. 1-11.
Canegallo, R. et al, "3D Contactless Communication for IC Design," IEEE International Conference on Integrated Circuit Design and Technology and Tutorial; Jun. 2-4, 2008; ISBN 978-1-4244-1810-7; pp. 241-244.
Chen, B., "iCoupler Products with isoPower Technology: Signal and Pwer Transfer Across Isolation Barrier Using Microtransformers," Analog Devices, www.analog.com, Apr. 2006, pp. 1-4.
Krakauer, D., "Anatomy of a Digital Isolator," Analog Devices, Technical Article MS-2234, www.analog.com, Oct. 2011, pp. 1-3.
Wayne, S. "iCoupler Digital Isolators Protect RS-232, RS-485, and CAN Buses in Indistrial, Instrumentation, and Computer Applications," Analog Dialogue 39-10, http://www.analog.com/analogdialogue; Oct. 2005, pp. 1-4.
Final Rejection mailed Nov. 5, 2015 for U.S. Appl. No. 13/930,250, 18 pages.
Notice of Allowance mailed Aug. 20, 2015 for U.S. Appl. No. 14/573,674, 9 pages.

METHODS OF MANUFACTURING AND OPERATING DIE-TO-DIE INDUCTIVE COMMUNICATION DEVICES

RELATED APPLICATION

This patent application is a divisional of co-pending, U.S. patent application Ser. No. 14/104,355, filed on Dec. 12, 2013, and issued as U.S. Pat. No. 9,100,063.

TECHNICAL FIELD

Embodiments relate generally to inductive communication circuits, systems, and methods.

BACKGROUND

In a variety of applications, electrical (or galvanic) isolation is desired between distinct circuits while enabling communication between those circuits. "Galvanic isolation" means that there is no metallic or highly conductive path between the distinct circuits. For example, galvanic isolation may be desired to protect a first circuit that operates at a relatively low supply voltage from a second circuit that operates at a relatively high supply voltage difference from the first circuit. In addition, galvanic isolation may be desired to isolate a first circuit tied to a first voltage reference (e.g., ground) from a second circuit tied to a different voltage reference (e.g., a floating voltage reference). Galvanic isolation also may be desired to prevent extraneous transient signals produced by one circuit from being conveyed to and processed by another circuit as valid signals or data.

A specific application that may benefit from galvanic isolation may be found within an automotive hybrid electric vehicle (HEV) system, for example. In an HEV system, a circuit that includes an insulated gate bipolar transistor (IGBT) array and corresponding gate drivers (referred to as an "IGBT circuit") may be used to rectify AC power, and to provide the resulting DC power to a high voltage battery (e.g., 300 volts (V) or more). A grounded control circuit (e.g., including a microcontroller) operating at a significantly lower vehicle chassis voltage (e.g., 12 V) may be used to provide control signals to the gate drivers. In order to isolate the control circuit from switching noise from the IGBT circuit, it may be desirable to provide complete galvanic isolation between the control circuit and the IGBT circuit.

In other systems, for safety reasons, it may be desirable to isolate equipment that is connected to an AC power line from conductive portions of the equipment that users can touch. In such systems, an isolation circuit may be used to mitigate the likelihood of shocks, burns, and/or electrocution from current flowing through a human body to ground.

Conventional techniques for providing electrical isolation include the use of optical isolators, capacitive isolators, transformer-based isolators, and so on. However, these techniques may be non-optimal or unsuitable for some applications, in that they may be expensive, require a large amount of space, consume significant power, and/or have some other characteristics that may reduce their desirability for a given application.

DETAILED DESCRIPTION

As will be described in more detail below, embodiments described herein include inductive communication devices that may be incorporated into systems in which galvanic isolation between circuits is desired. As will be described in more detail later, embodiments of inductive communication devices include at least three IC die (or two IC die and non-IC inductive coupling substrate), and at least two of the IC die include a conductive coil. Corresponding coils within the multiple die are aligned with each other across a gap. One or more dielectric components (including a physical dielectric structure) may be positioned within the gap, where the dielectric component(s) have properties that provide a desired level of galvanic isolation between the coils. Bond pads on the top surfaces of at least two of the IC die are electrically coupled (e.g., using wirebonds) to package leads. According to an embodiment, at least two of the IC die also may include communication circuitry (e.g., transmitter, receiver, and/or transceiver circuitry), where the communication circuitry converts input signals into communication signals that are conducive to inductive communication, and after the communication signals have been inductively communicated, converts the communication signals into an approximation of the input signals. According to an embodiment, the multiple IC die and the intervening dielectric component(s) all are packaged within a single integrated circuit package.

Figure 1:
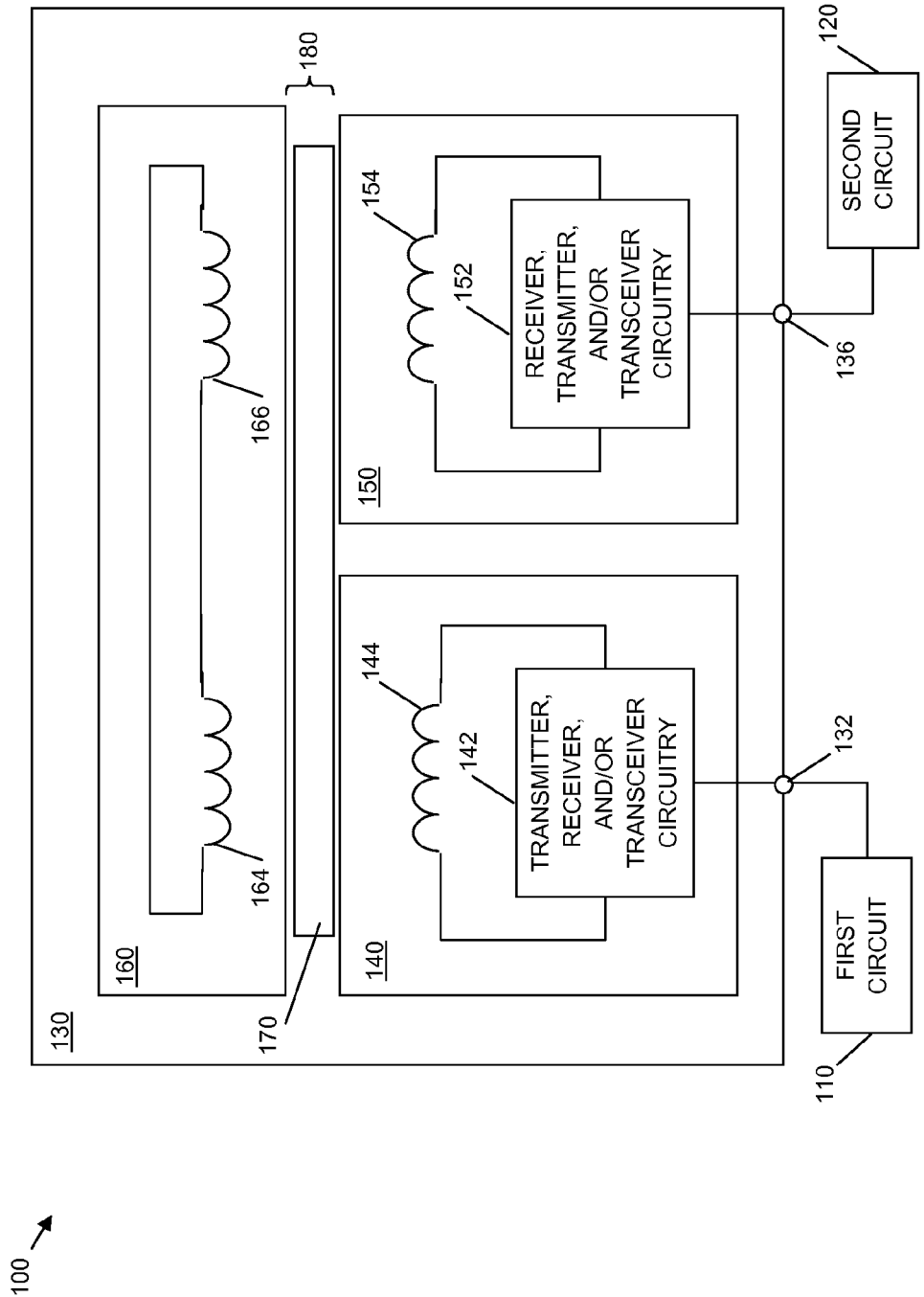
FIG. 1 is a simplified, circuit diagram illustrating a system that includes an inductive communication device that provides galvanic isolation between first and second circuits, according to an example embodiment.

FIG. 1 is a simplified, circuit diagram illustrating a system 100 that includes an inductive communication device 130 that provides galvanic isolation between first and second circuits 110, 120, according to an example embodiment. Accordingly, inductive communication device 130 alternatively may be referred to as a "galvanic isolation device." In system 100, the first circuit 110 may operate at a relatively low supply voltage, and the second circuit 120 may operate at a voltage difference from circuit 110, although circuits 110, 120 may operate without a voltage difference, as well. In addition or alternatively, the first circuit 110 may be tied to a first voltage reference point (e.g., ground) and the second circuit 120 may be tied to a different voltage reference point (e.g., a floating voltage level), although circuits 110, 120 may be tied to the same voltage reference point, as well. System 100 may, for example, form a portion of a battery charging system for an HEV (e.g., the first circuit 110 may include a control circuit, and the second circuit 120 may include an array of IGBTs and associated gate drivers), a portion of an AC power isolation system, or may form a portion of another type of system in which galvanic isolation between first and second circuits is desired.

The various components of inductive communication device 130 are packaged in a single package (e.g., an air-cavity package or overmolded package), in an embodiment. These components include a first integrated circuit (IC) die 140, a second IC die 150, an inductive coupling substrate 160, and one or more dielectric components (including dielectric structure 170) positioned between the first and second IC die 140, 150 and the inductive coupling substrate 160. As used herein, a "dielectric component" may be an air gap or a physical structure that includes dielectric material (e.g., a layer of dielectric material or another type of structure that includes dielectric material). As will be better illustrated in the Figures that follow, the first and second IC die 140, 150 and the inductive coupling substrate 160 are physically arranged with respect to each other to provide inductive communication between the first IC die 140 and the inductive coupling substrate 160 across a gap 180, and also to provide further inductive communication between the inductive coupling substrate 160 and the second IC die 150 across the gap 180. The dielectric structure 170 is positioned within the gap 180. In some embodiments, the dielectric structure 170 may substantially fill the gap 180 between the surfaces of the first and second IC die 140, 150 and the inductive coupling substrate 160. In other embodiments, one or more air gaps may be present within the gap 180 (i.e., the gap 180 may not be completely filled by the dielectric structure 170).

Each of the first and second IC die 140, 150 includes communication circuitry 142, 152 electrically coupled with a coil 144, 154. For example, the communication circuitry 142, 152 may include transmitter circuitry, receiver circuitry, or transceiver circuitry, in various embodiments. According to an embodiment, each instance of the communication circuitry 142, 152 is formed on a same substrate (or within the same IC) as the coil 144, 154 to which it is connected. In other embodiments, the communication circuitry 142, 152 may be formed on a separate IC from its associated coil 144, 154. In such embodiments, the IC that includes the coil 144, 154 and the IC that includes the corresponding communication circuitry 142, 152 may both be included within a single packaged device, or may be in distinctly packaged devices.

The inductive coupling substrate 160 includes two electrically connected coils 164, 166, in an embodiment. The inductive coupling substrate 160 may be formed on a semiconductor substrate, in an embodiment. Alternatively, the inductive coupling substrate 160 may be formed using a non-semiconductor substrate (e.g., a substrate formed from printed circuit board (PCB) materials). The first and second IC die 140, 150 and/or the inductive coupling substrate 160 also may include tuning capacitors (not illustrated) configured to enhance the resonance between primary/secondary coil pairs (e.g., between coil pair 144, 164 and coil pair 154, 166).

In an embodiment in which the communication circuitry 142, 152 includes transceiver circuitry, the inductive communication device 130 may provide bi-directional communication between the circuits 110, 120. More specifically, communication of a signal between the first circuit 110 and the second circuit 120 may be conducted by sending a signal from the first circuit 110 to the first transceiver circuitry 142 via node 132, then further communicating the signal electrically from the first transceiver circuitry 142 to coil 144. The signal may then be inductively communicated from the coil 144 to a corresponding coil 164 within the inductive coupling substrate 160. The signal then may be electrically communicated from coil 164 to coil 166 within the inductive coupling substrate 160. Continuing on, the signal then may be inductively communicated from coil 166 to coil 154 within the second IC die 150, and then electrically communicated from coil 154 to transceiver circuitry 152. Finally, the signal may be electrically communicated from transceiver circuitry 152 to the second circuit 120 via node 136. Communication between the second circuit 120 and the first circuit 110 may be similarly conducted, although in a reverse direction. In an embodiment in which communication circuitry 142 includes only transmitter circuitry and communication circuitry 152 includes only receiver circuitry, the inductive communication device 130 supports only one-way communication from first circuit 110 to the second circuit 120. Conversely, in an embodiment in which communication circuitry 142 includes only receiver circuitry and communication circuitry 152 includes only transmitter circuitry, the inductive communication device 130 supports only one-way communication from second circuit 120 to the first circuit 110.

Operation of inductive communication device 130 will now be described in more detail. For ease of description, the operation will be described in conjunction with communicating a signal from first circuit 110 through the inductive communication device 130 to the second circuit 120. Those of skill in the art would understand, based on the description herein, that a signal similarly could be conducted from the second circuit 120 through the inductive communication device 130 to the first circuit 110.

In order to communicate a signal from the first circuit 110 to the second circuit 120, the communication circuitry 142 first receives an input signal via node 132 from the first circuit 110. The communication circuitry 142 then converts the input signal into a form that is appropriate for inductive communication by coil 144, which will be functioning as a primary coil. More specifically, in an embodiment, the communication circuitry 142 may provide a time-varying (e.g., oscillating) drive signal (e.g., an alternating current in the form of a sinusoidal wave, a square wave, or another wave pattern) to coil 144. Coil 144 converts the drive signal into a time-varying magnetic field or flux around the coil 144. The time-varying magnetic field or flux generated by coil 144 extends across the gap 180 through the dielectric structure 170 (and other dielectric components, if they are present within the gap 180) and couples with a corresponding coil 164 within the inductive coupling substrate 160. A time-varying magnetic field or flux originating from a primary coil (e.g., coil 144), extending across a gap (e.g., gap 180), and received by a secondary coil (e.g., coil 164) may be referred to herein as an "inductive communication signal." As described above, an inductive communication signal is transmitted from a primary coil (e.g., coil 144) to a secondary coil (e.g., coil 164) through magnetic inductive coupling between the primary/secondary coil pair. In response to the inductive communication signal coupling with coil 164, coil 164 produces an alternating waveform or voltage, which is electrically conveyed to coil 166 of the inductive coupling substrate 160. Similar to the manner in which coils 144 and 164 communicated, the alternating waveform or voltage received by coil 166 is converted, by coil 166, into a time-varying magnetic field or flux around coil 166. The time-varying magnetic field or flux generated by coil 166 extends across the gap 180 through the dielectric structure 170 (and other dielectric components, if they are present within the gap 180) and couples with a corresponding coil 154 within the second IC die 150. In other words, coil 166 functions in the capacity of a primary coil, coil 154 functions in the capacity of a secondary coil, and an inductive communication signal is conveyed between coil 166 and 154. Coil 154 converts the inductive communication signal into a time-varying signal, which is received by communication circuitry 152. Communication circuitry 152 then converts the signal received from coil 154 into a reconstructed version of the input signal (i.e., the signal received at node 132), and provides the reconstructed version of the input signal to the second circuit 120 via node 136.

According to an embodiment, when capable of functioning as a transmitter, communication circuitry 142, 152 includes an oscillator (not illustrated) and a driver circuit (not illustrated) configured to provide a time-varying drive signal to the coil 144, 154 to which the communication circuitry 142, 152 is coupled. For example, the driver circuit may receive an input signal (e.g., from first circuit 110 or second circuit 120), and may convert the input signal into an alternating signal having characteristics that are conducive to inductive communication between a primary/secondary coil pair.

According to an embodiment, for example, input signal may be an information carrying square wave, and the driver circuit may implement amplitude-shift keying (ASK) modulation to represent the digital data conveyed in the input signal. More specifically, for example, the driver circuit may implement on-off keying (OOK), in which the driver circuit produces a carrier wave at a frequency established by the oscillator when the input signal has a relatively high logic level (e.g., indicating a binary one). Conversely, the driver circuit refrains from producing the carrier wave when the input signal has a relatively low logic level (e.g., indicating a binary zero). In alternate embodiments, the driver circuit may implement other modulation techniques (e.g., frequency modulation, phase modulation or other techniques). According to an embodiment, the carrier wave conveyed within the drive signal may have a frequency in a band extending between about 200 megahertz (MHz) and about 400 MHz (e.g., at a frequency of about 300 MHz), although the carrier wave may have higher or lower frequencies in other bands, as well.

According to a further embodiment, when capable of functioning as a transmitter, communication circuitry 142, 152 includes an amplifier, a detector (not illustrated) and other circuitry configured to convert the time-varying communication signal received from the coil 144, 154 to which it is coupled into a reconstructed version of the signal that was originally provided to the inductive communication device 130 (e.g., by the first or second circuit 110, 120).

The dielectric structure 170 (and other dielectric components, if present in the gap 180) is positioned between each primary/secondary coil pair (i.e., between coils 144, 164 and between coils 154, 166). Although a single dielectric structure 170 is illustrated in FIG. 1, distinct dielectric structures may be used, in other embodiments (e.g., one dielectric structure for each primary/secondary coil pair), or the dielectric structure 170 may be composed of distinct layers with different dielectric properties. In addition, as mentioned previously, other dielectric components may be present within the gap 180.

The dielectric structure 170 (and other dielectric components, if present within the gap 180) provides DC isolation (galvanic isolation) between the first and second IC die 140, 150 and the inductive coupling substrate 160, and thus between the first circuit 110 and the second circuit 120. The level of DC isolation provided is affected by the combined thickness of the dielectric structure 170 and any other dielectric components within the gap 180 (or the width of the gap 180 that is established by the dielectric structure 170 and other dielectric components, if present) and the dielectric constant(s) of the dielectric structure 170 and any other dielectric components within the gap 180. For example, the dielectric structure 170 and other dielectric components, if present, may be configured to provide DC isolation in a range of about 1.0 kilovolts (kV) to about 4.0 kV, or more desirably from about 2.0 kV to about 5.0 kV, although dielectric structure 170 and other dielectric components, if present, may be configured to provide more or less DC isolation, as well.

Figure 2:
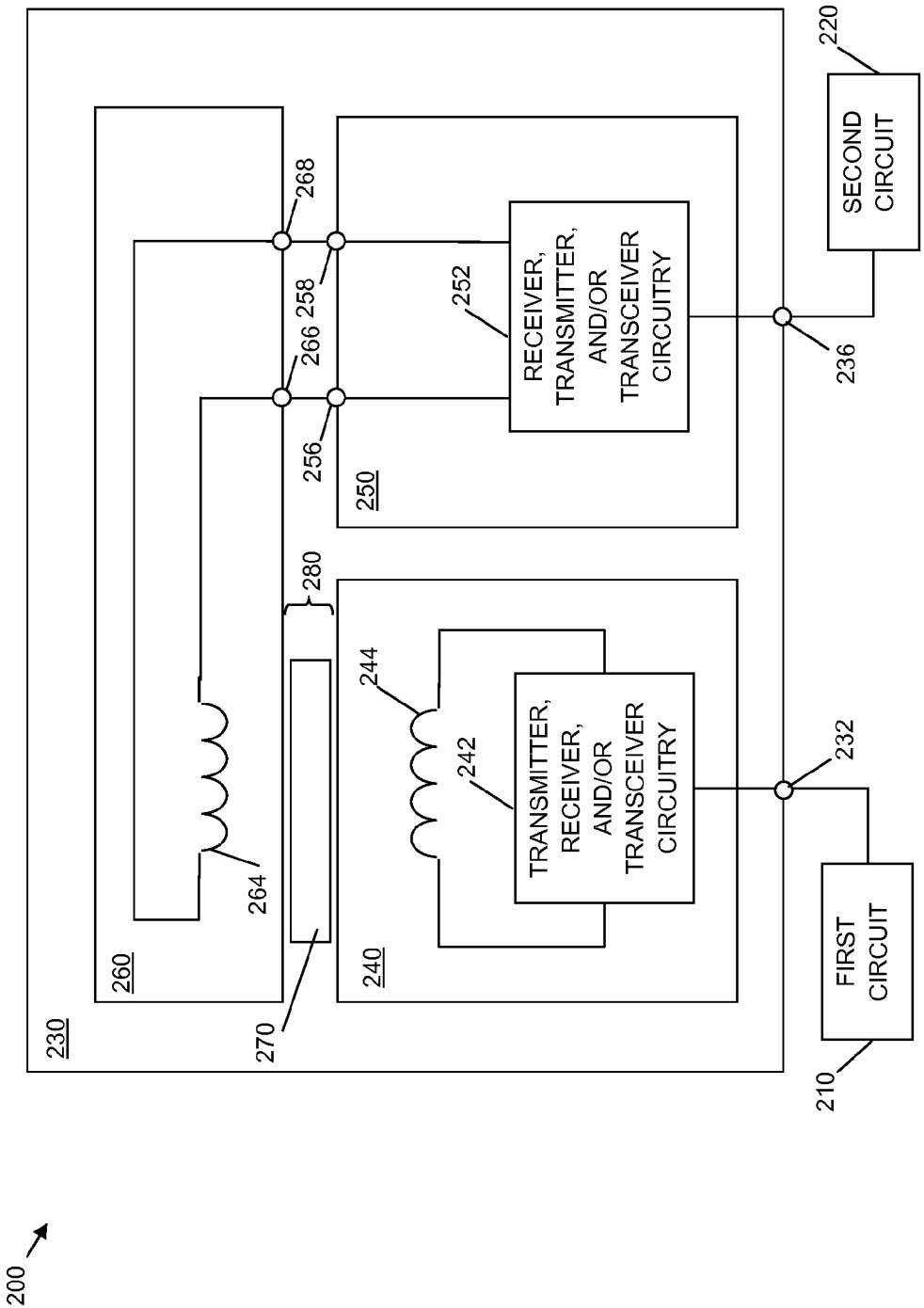
FIG. 2 is a simplified, circuit diagram illustrating a system that includes an inductive communication device, according to another example embodiment.

FIG. 2 is a simplified, circuit diagram illustrating a system 200 that includes an inductive communication device 230 (or galvanic isolation device), according to another example embodiment. System 200 is similar to system 100 of FIG. 1, in that system 200 includes first and second circuits 210, 220 electrically coupled to an inductive communication device 230 via nodes 232, 236. In addition, inductive communication device 230 includes a first IC die 240, an inductive coupling substrate 260, a second IC die 250, and one or more dielectric components (including dielectric structure 270), all of which may be packaged in a single package, in an embodiment. A substantial difference between inductive communication device 230 and inductive communication device 130 is that, in inductive communication device 230 the inductive coupling substrate 260 and the second IC die 250 are communicatively coupled through direct electrical connections, rather than through an inductive communication link.

The first and second IC die 240, 250 and the inductive coupling substrate 260 are physically arranged with respect to each other to provide inductive communication between the first IC die 240 and the inductive coupling substrate 260 across a gap 280, and also to provide direct electrical communication between the inductive coupling substrate 260 and the second IC die 250. Dielectric structure 270 is positioned between the first IC die 240 and the inductive coupling substrate 260, or more particularly in the gap 280 between coils 244, 264 of the first IC die 240 and the inductive coupling substrate 260, respectively. In some embodiments, the dielectric structure 270 may substantially fill the gap 280 between the surfaces of the first IC die 240 and the inductive coupling substrate 260. In other embodiments, one or more air gaps may be present within the gap 280 (i.e., the gap 280 may not be completely filled by the dielectric structure 270). The dielectric structure 270 (and other dielectric components, if present within the gap 280) provides DC isolation (galvanic isolation) between the first IC die 240 and the inductive coupling substrate 260, and thus between the first IC die 240 and the second IC die 250, or between the first circuit 210 and the second circuit 220.

First IC die 240 is substantially the same as first IC die 240, in that first IC die 240 includes communication circuitry 242 (e.g., transmitter circuitry, receiver circuitry, or transceiver circuitry) coupled to a coil 244. Second IC die 250 also includes communication circuitry 252, although communication circuitry 252 is electrically coupled with electrical contacts 256, 258, rather than being coupled with a coil. According to an embodiment, communication circuitry 242 is formed on a same substrate (or within the same IC) as the coil 244, and communication circuitry 252 is formed on a same substrate (or within the same IC) as the contacts 256, 258.

The inductive coupling substrate 260 includes coil 264 electrically coupled with contacts 266, 268, in an embodiment. Contacts 266, 268 of the inductive coupling substrate 260 are electrically coupled with contacts 256, 258 of the second IC die 250, so as to enable direct electrical communication between the inductive coupling substrate 260 and the second IC die 250. The inductive coupling substrate 260 may be formed on a semiconductor substrate, in an embodiment. Alternatively, the inductive coupling substrate 260 may be formed using a non-semiconductor substrate (e.g., a substrate formed from PCB materials). The first IC die 240, second IC die 250, and/or the inductive coupling substrate 260 also may include tuning capacitors (not illustrated) configured to enhance the resonance between coils 244, 264.

In an embodiment in which the communication circuitry 242, 252 includes transceiver circuitry, the inductive communication device 230 may provide bi-directional communication between the circuits 210, 220. More specifically, communication of a signal between the first circuit 210 and the second circuit 220 may be conducted by sending a signal from the first circuit 210 to the first transceiver circuitry 242 via node 232, then further communicating the signal electrically from the first transceiver circuitry 242 to coil 244. The signal may then be inductively communicated from the coil 244 to a corresponding coil 264 within the inductive coupling substrate 260. The signal then may be electrically communicated from coil 264 to contacts 266, 268 of the inductive coupling substrate 260. Continuing on, the signal then may be electrically communicated from contacts 266, 268 to contacts 256, 258 of the second IC die 250, and then electrically communicated from contacts 256, 258 to transceiver circuitry 252. Finally, the signal may be electrically communicated from transceiver circuitry 252 to the second circuit 220 via node 236. Communication between the second circuit 220 and the first circuit 210 may be similarly conducted, although in a reverse direction. As the above description indicates, either a coil or a contact may function as a signal communication interface for an IC die or an inductive coupling substrate. Therefore, the term "signal communication interface" may be used to refer to either a coil or a contact.

In an embodiment in which communication circuitry 242 includes only transmitter circuitry and communication circuitry 252 includes only receiver circuitry, the inductive communication device 230 supports only one-way communication from first circuit 210 to the second circuit 220. Conversely, in an embodiment in which communication circuitry 242 includes only receiver circuitry and communication circuitry 252 includes only transmitter circuitry, the inductive communication device 230 supports only one-way communication from second circuit 220 to the first circuit 210. Essentially, operation of inductive communication device 230 is similar to operation of inductive communication device 130, except with respect to the communication link between inductive coupling substrate 260 and second IC die 250, which is a direct electrical communication link, rather than an inductive communication link.

Although inductive communication devices 130, 230 each are shown to provide one communication path between first and second circuits 110, 120, 210, 220, other embodiments of inductive communication devices may provide multiple communication paths (e.g., multiple forward, reverse, and/or bi-directional communication paths, such as is depicted in FIGS. 12-15).

Various embodiments of an inductive communication device (e.g., device 130, 230) and configurations of IC die (e.g., IC die 140, 150, 240, 250), inductive coupling substrates (e.g., inductive coupling substrates 160, 260), and interposed dielectric structures (e.g., dielectric structures 170, 270) will now be described in more detail. More specifically, FIGS. 3 and 4 correspond to embodiments of inductive communication devices 300, 400 that represent physical implementations of the circuit diagram for inductive communication device 130 (FIG. 1), and FIG. 5 corresponds to an embodiment of an inductive communication device 500 that represents a physical implementation of the circuit diagram for inductive communication device 230 (FIG. 2).

Figure 3:
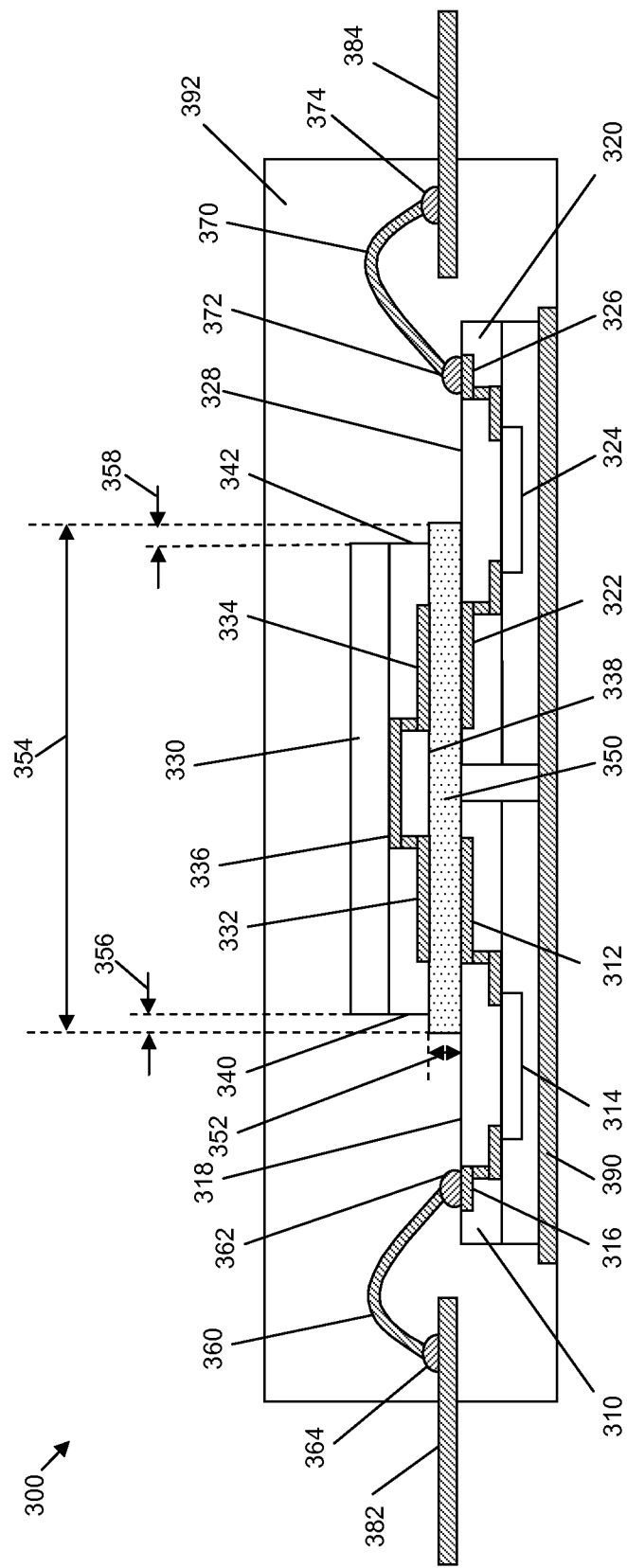
FIG. 3 is a cross-sectional, side view of an inductive communication device, according to an example embodiment.

FIG. 3 is a cross-sectional, side view of an inductive communication device 300 (e.g., inductive communication device 130, FIG. 1), according to an example embodiment. Inductive communication device 300 includes a first IC die 310, a second IC die 320, an inductive coupling substrate 330, a dielectric structure 350 positioned between the inductive coupling substrate 330 and each of the first and second IC die 310, 320, a plurality of leads 382, 384, and a plurality of wirebonds 360, 370, in an embodiment. In addition, inductive communication device 300 may include a support structure 390 and encapsulation 392. More particularly, in the embodiment depicted in FIG. 3, the electrical components of inductive communication device 300 of FIG. 3 are housed in an overmolded package (i.e., a package in which the electrical components are substantially encased in a non-conductive (e.g., plastic) encapsulant material). As mentioned previously, embodiments of inductive communication devices alternatively may include electrical components housed in an air-cavity package (i.e., a package in which the electrical components are located within an air cavity within the package, where the air cavity is typically sealed with a lid).

First IC die 310 includes at least one coil 312 (e.g., coil 144, FIG. 1), at least one instantiation of communication circuitry 314 (e.g., communication circuitry 142, FIG. 1), a plurality of bond pads 316, and various conductive traces and vias interconnecting the coil(s) 312, communication circuitry 314, and bond pads 316. In an alternate embodiment, as mentioned previously, the communication circuitry 314 may be included in a separate die within the same package as the die that contains the coil(s) 312, or the communication circuitry 314 may be separately packaged. In any of the above-described embodiment, the bond pads 316 may be considered to be electrically coupled to the coil(s) 312 (e.g., either directly or indirectly through communication circuitry 314). According to an embodiment, the communication circuitry 314 is formed in a semiconductor substrate, and the coil(s) 312 are formed in build-up layers overlying the semiconductor substrate.

Similar to first IC die 310, second IC die 320 includes at least one coil 322 (e.g., coil 154, FIG. 1), at least one instantiation of communication circuitry 324, a plurality of bond pads 326, and various conductive traces and vias interconnecting the coil(s) 322, communication circuitry 324, and bond pads 326. As was the case with the first IC die 310, in an alternate embodiment, the communication circuitry 324 may be included in a separate die within the same package as the die that contains the coil 322, or the communication circuitry 324 may be separately packaged. In whichever embodiment, the bond pads 326 may be considered to be electrically coupled to the coil 322 (e.g., either directly or indirectly through communication circuitry 324). According to an embodiment, the communication circuitry 324 is formed in a semiconductor substrate, and the coil(s) 322 are formed in build-up layers overlying the semiconductor substrate.

Inductive coupling substrate 330 includes first and second coils 332, 334 electrically coupled together through a conductive structure 336. The conductive structure 336 may include various conductive traces and vias interconnecting the coils 332, 334, in an embodiment. Essentially, inductive coupling substrate 330 may include only passive structures, in an embodiment. In an alternate embodiment, inductive coupling structure 330 may include one or more active components. For example, in an alternate embodiment, inductive coupling structure 330 may include an amplifier configured to amplify a signal to be communicated between coils 332, 334. According to an embodiment, coils 332, 334 are formed in build-up layers overlying a semiconductor substrate. In an alternate embodiment, coils 332, 334 may be formed in or on a substrate comprised of PCB materials or other materials.

According to an embodiment, each one of coils 312, 322, 332, 334 is proximate to a surface 318, 328, 338 of the IC die 310, 320 or inductive coupling substrate 330 in which it is included. As used herein, the term "proximate to a surface," when referring to the position of a coil, means that a portion of the coil is either exposed at the surface, or that one or more non-conductive layers of material (e.g., dielectric layers) is disposed over the coil, where the surface of the overlying non-conductive layer(s) establishes the surface of the IC or substrate.

In any event, the surfaces 318, 328, 338 of the first and second IC die 310, 320 and the inductive coupling substrate 330 to which the coils 313, 322, 332, 334 are proximate are arranged to face each other within device 300 so that a first pair of coils 312, 332 are aligned with each other across a gap that is established by the dielectric structure 350, and a second pair of coils 322, 334 also are aligned with each other across the gap. The alignment of the coil pairs 312, 332 and 322, 334 across the gap enables inductive communication to occur between aligned coil pair 312 and 332, and also between aligned coil pair 322 and 334.

Dielectric structure 350 is positioned within the gap directly between the coil pairs 312, 332 and 322, 334, and may extend laterally beyond the coil pairs 312, 332 and 322, 334. According to an embodiment, a thickness 352 of the dielectric structure 350 substantially equals the width of the gap between the coil pairs 312, 332 and 322, 334. Accordingly, the level of galvanic isolation between the coil pairs 312, 332 and 322, 334 (and thus the IC die 310, 320) is directly related to the thickness 352 of the dielectric structure 350 and the material(s) from which the dielectric structure 350 is formed. In other embodiments, other dielectric components may be present within the gap between the coil pairs 312, 332 and 322, 334, as well. According to an embodiment, dielectric structure 350 may have a thickness 352 in a range of about 25 micrometers (μm) to about 400 μm, or more desirably from about 100 μm to about 200 μm, although dielectric structure 350 may be thinner or thicker, as well.

According to a further embodiment, the dielectric structure 350 has a width 354, which is sufficient to allow the dielectric structure 350 to extend beyond the edges 340, 342 of the inductive coupling substrate 330 by distances 356, 358. This extension of the dielectric structure 350 beyond the edges 340, 342 of the inductive coupling substrate 330 may result in a reduction in fringing effects that may be present near the edges 340, 342.

Dielectric structure 350 may have a dielectric constant in a range of about 2.0 to about 5.0, although dielectric structure 350 may have a lower or higher dielectric constant, as well. According to an embodiment, dielectric structure 350 includes a material selected from polyimide, polytetrafluoroethylene, benzocyclobutene, or other materials with a suitable dielectric constant. According to a particular embodiment, dielectric structure 350 has adhesive top and/or bottom sides (e.g., dielectric structure 350 may be configured as a tape made from one of the aforementioned materials). Dielectric structure 350 may be formed from a single layer of material, or dielectric structure 350 may be formed from multiple layers of a single material or multiple materials, in various embodiments.

Support structure 390 and leads 382, 384 may form portions of a leadframe, in an embodiment. In the illustrated embodiment, the support structure 390 and leads 382, 384 are not co-planar. Accordingly, the support structure 390 essentially coincides with a bottom surface of device 300, and leads 382, 384 extend from the sides of device 300 at locations that are between the bottom and top surfaces of the device 300. In alternate embodiments, the support structure 390 and leads 382, 384 may be co-planar. In such embodiments, the leads either may extend outward from the bottom of the device 300, or the leads may terminate at the sides of the device 300 (e.g., in flat no-leads types of packages).

In the embodiment illustrated in FIG. 3, the first and second IC die 310, 320 are coupled to support structure 390, the dielectric structure 350 is positioned on surfaces 318, 328 of the first and second IC die 310, 320, and surface 338 of the inductive coupling substrate 330 is coupled to a top surface of dielectric structure 350. Portions of the surfaces 318, 328 of the first and second IC die 310, 320 overlap the surface 338 of the inductive coupling substrate 330 to allow the coil pairs 312, 332 and 322, 334 to be aligned with each other. The bond pads 316 of the first IC die 310 are coupled to leads 382 extending from a first side of the device 300 via wirebonds 360. More particularly, a first end 362 of each wirebond 360 is coupled to a bond pad 316 of first IC die 310, and a second end 364 of each wirebond 360 is coupled to a lead 382. Similarly, the bond pads 326 of the second IC die 320 are coupled to leads 384 extending from a second side of the device 300 via wirebonds 370. More particularly, a first end 372 of each wirebond 370 is coupled to a bond pad 326 of second IC die 320, and a second end 374 of each wirebond 370 is coupled to a lead 384. Leads 382, 384 may correspond to an input node and an output node (e.g., one of leads 382, 384 may correspond to one of nodes 132, 136, and the other one of leads 382, 384 may correspond to the other one of nodes 132, 136, FIG. 1).

The cross-sectional view illustrated in FIG. 3 depicts a single communication path between leads 382, 384. For example, the direction of the communication path may be from lead 382 to lead 384. In such a case, communication circuitry 314 of the first IC die 310 may be transmitter or transceiver circuitry (e.g., communication circuitry 142 FIG. 1), and the coil 312 of the first IC die 310 may function as a primary coil. Correspondingly, communication circuitry 324 of the second IC die 320 may be receiver or transceiver circuitry (e.g., communication circuitry 152, FIG. 1), and the coil 322 of the second IC die 320 may function as a secondary coil. In the above-given scenario, within inductive coupling substrate 330, coil 332 may function as a secondary coil, and coil 334 may function as a primary coil.

Alternatively, the direction of the communication path may be from lead 384 to lead 382. In this case, communication circuitry 324 of the second IC die 320 may be transmitter or transceiver circuitry, and the coil 322 of the second IC die 320 may function as a primary coil. Correspondingly, communication circuitry 314 of the first IC die 310 may be receiver or transceiver circuitry, and the coil 312 of the first IC die 310 may function as a secondary coil. In this scenario, within inductive coupling substrate 330, coil 334 may function as a secondary coil, and coil 332 may function as a primary coil. Although only a single communication path is depicted in FIG. 3, inductive communication device 300 also may include one or more additional communication paths in the same direction and/or the opposite direction as the communication path depicted in FIG. 3.

Figure 4:
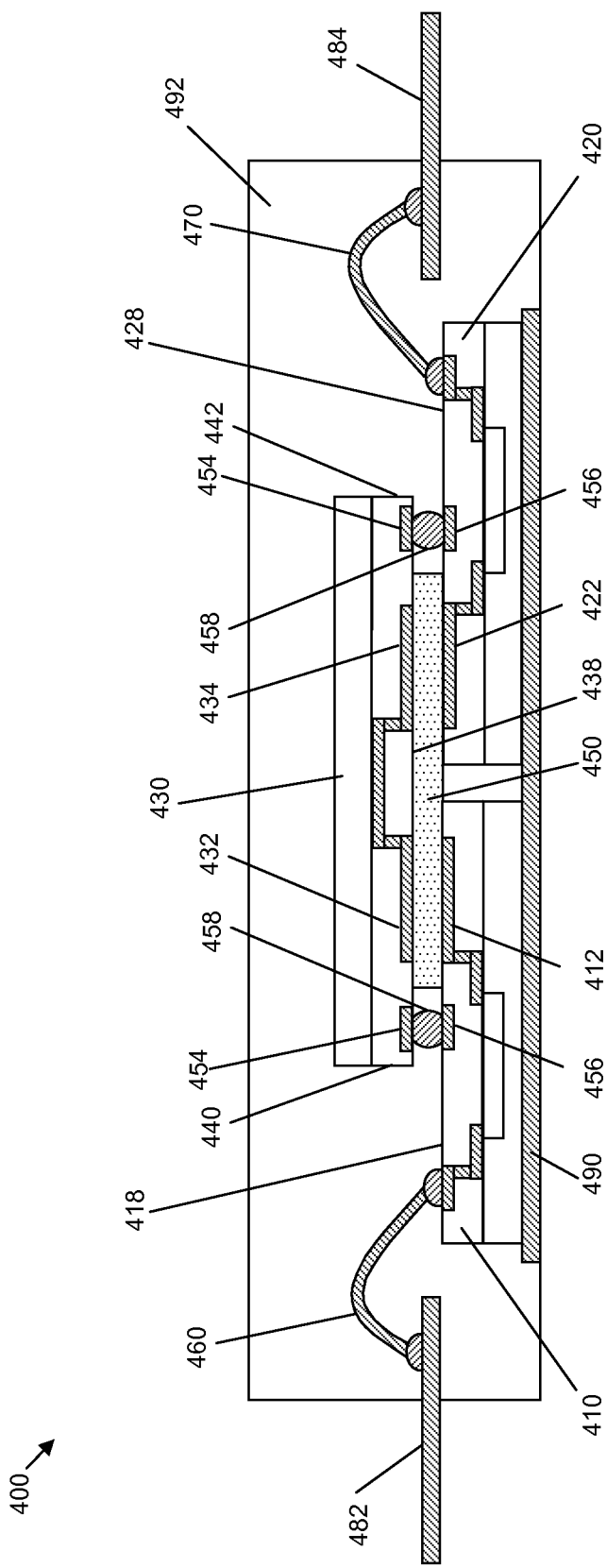
FIG. 4 is a cross-sectional, side view of an inductive communication device, according to another example embodiment.

FIG. 4 is a cross-sectional, side view of an inductive communication device 400, according to another example embodiment. As mentioned above, as with inductive communication device 300 (FIG. 3) discussed above, inductive communication device 400 also represents a physical implementation of the circuit diagram for inductive communication device 130 (FIG. 1). Inductive communication device 400 includes a number of similarities to inductive communication device 300, and for the purpose of brevity, details regarding substantially similar elements and features will not be repeated here.

Inductive communication device 400 includes a first IC die 410, a second IC die 420, an inductive coupling substrate 430, a dielectric structure 450 positioned between the inductive coupling substrate 430 and each of the first and second IC die 410, 420, a plurality of leads 482, 484, and a plurality of wirebonds 460, 470, in an embodiment. In addition, in an embodiment in which inductive communication device 400 is housed in an overmolded package, inductive communication device 400 may include a support structure 490 and encapsulation 492. In an alternate embodiment, the electrical components of inductive communication device 400 may be housed in an air-cavity package. Inductive communication device 400 provides galvanic isolation between leads 482, 484 and enables inductive communication through coil pairs 412, 432 and 422, 434.

Inductive communication device 400 differs from the previously-described inductive communication device 300 in that inductive communication device 400 additionally may include features that enhance the robustness of the mechanical connection between the inductive coupling substrate 430 and the first and second IC die 410, 420. More specifically, according to an embodiment, the inductive coupling substrate 430 includes bond pads 454 at surface 438, which may be mechanically coupled with correspondingly aligned bond pads 456 at the surfaces 418, 428 of the first and second IC die 410, 420. The aligned bond pad pairs 454, 456 may be physically coupled with a coupling structure 458, such as solder, bumps, posts, or other structures. In an embodiment the mechanical coupling structures (i.e., structures formed form aligned bond pads 454, 456 and a coupling structure 458) are not electrically coupled with any circuitry of the device 400.

So as not to interfere with the coupling structures 458, inductive communication device 400 also may have a dielectric structure 450 with a modified shape, when compared with the embodiment of dielectric structure 350, FIG. 3. More specifically, although the dielectric structure 450 may (or may not) extend beyond the edges 440, 442 of the inductive coupling substrate 430 in areas where the coupling structures 458 are not proximate the edges 440, 442, the dielectric structure 450 may be recessed from the edges 440, 442 in areas where the coupling structures 458 are present, as indicated in FIG. 4.

Figure 5:
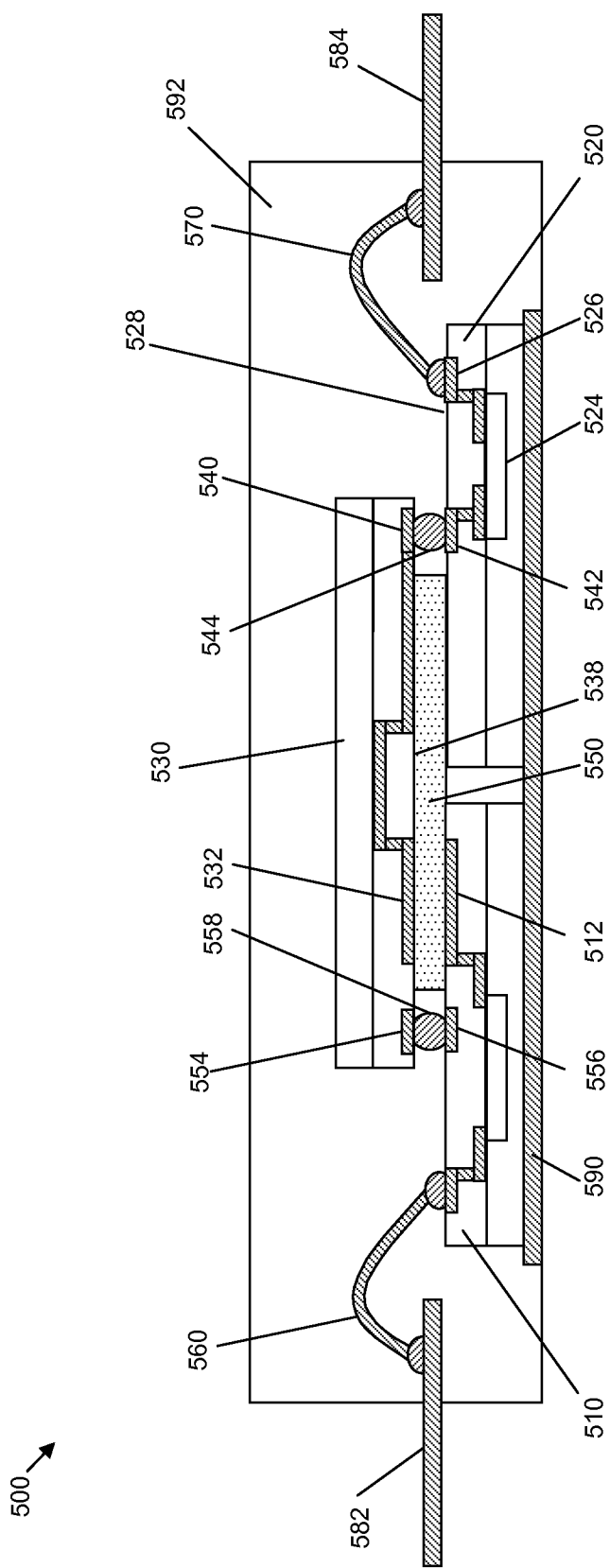
FIG. 5 is a cross-sectional, side view of an inductive communication device, according to yet another example embodiment.

FIG. 5 is a cross-sectional, side view of an inductive communication device 500, according to yet another example embodiment. As mentioned above, inductive communication device 500 represents a physical implementation of the circuit diagram for inductive communication device 230 (FIG. 2). Inductive communication device 500 includes a number of similarities to inductive communication devices 300, 400, and for the purpose of brevity, details regarding substantially similar elements and features will not be repeated here.

Inductive communication device 500 includes a first IC die 510, a second IC die 520, an inductive coupling substrate 530, a dielectric structure 550 positioned between the inductive coupling substrate 530 and at least the first IC die 510, a plurality of leads 582, 584, and a plurality of wirebonds 560, 570, in an embodiment. In addition, in an embodiment in which inductive communication device 500 is housed in an overmolded package, inductive communication device 500 may include a support structure 590 and encapsulation 592. In an alternate embodiment, the electrical components of inductive communication device 500 may be housed in an air-cavity package.

First IC die 510 is substantially the same as the previously-discussed first IC die 310, 410, and the first IC die 510 and the inductive coupling substrate 530 may inductively communicate through aligned coils 512, 532, as previously described. However the inductive coupling substrate 530 and the second IC die 520 differ from the previously-discussed inductive coupling substrates 330, 430 and second IC die 320, 420, as the inductive coupling substrate 530 and the second IC die 520 include features that enable them to communicate through an electrical (non-inductive) interface. More specifically, although inductive coupling substrate 530 includes one or more first coils 532 for inductively communicating with first IC die 510, inductive coupling substrate 530 does not include additional coils for inductively communicating with second IC die 520. Instead, inductive coupling substrate 530 includes one or more electrical contacts 540 (e.g., bond pads) at surface 538 that are electrically coupled with the first coil(s) 532 (e.g., though trace(s) and/or via(s) of the inductive coupling substrate 530). In addition, although second IC die 520 also includes communication circuitry 524 and bond pads 526 (analogous to communication circuitry 324, 424 and bond pads 326, 426), second IC die 520 does not include a coil for inductively communicating with inductive coupling substrate 530. Instead, second IC die 520 includes one or more electrical contacts 542 (e.g., bond pads) at surface 528 that are electrically coupled to the communication circuitry 524 (e.g., though trace(s) and/or via(s) of the second IC die 520). The contact(s) 540 of the inductive coupling substrate 530 align with the contact(s) 542 of the second IC die 520, and the contacts 540, 542 are electrically coupled thorough one or more electrical connections 544 (e.g., solder, bumps, conductive posts, and/or other structures).

In addition to including contacts (e.g., contacts 540, 542) that provide electrical connections with circuitry of the first and/or second IC die 510, 520 and the inductive coupling substrate 530, the first and/or second IC die 510, 520 and the inductive coupling substrate 530 also may include mechanical coupling structures (e.g., structures formed from aligned bond pads 554, 556 and a coupling structure 558) that are not electrically coupled with any circuitry of the device 500.

Figure 6:
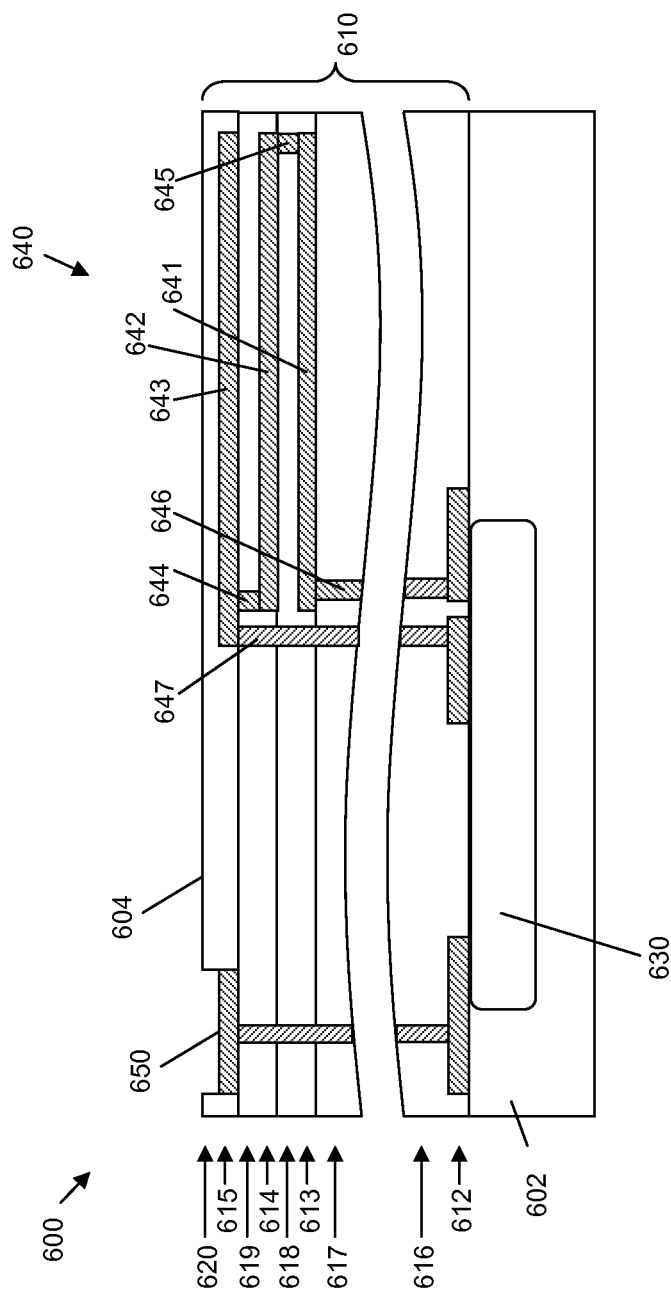
FIG. 6 is a cross-sectional, side view of an integrated circuit die that may be used in an inductive communication device, according to an example embodiment.

More detailed examples of embodiments of IC die and inductive coupling substrates will now be described. More particularly, FIG. 6 is a cross-sectional, side view of an IC die 600 that includes a coil 640 (e.g., IC die 140, 150, 240, 310, 320, 410, or 510, FIGS. 1-5) may be used in an inductive communication device (e.g., inductive communication device 130, 230, 300, 400, 500, FIGS. 1-5), according to an example embodiment. IC die 600 includes a semiconductor substrate 602, and a build-up structure 610 comprising a plurality of conductive layers 612, 613, 614, 615 and dielectric layers 616, 617, 618, 619, 620 on a top surface of the semiconductor substrate 602. For consistency with FIGS. 3-5 and enhanced understanding, IC die 600 is shown in the same orientation as IC die 310, 410, 510 of FIGS. 3-5 (i.e., with the surface 604 to which coil 640 is proximate facing upward).

Various active components forming communication circuitry 630 are formed in the semiconductor substrate 602. For example, the communication circuitry 630 may include transmitter circuitry, receiver circuitry or transceiver circuitry, in various embodiments. The components of the communication circuitry 630 are interconnected through conductive traces formed in some or all of the conductive layers 612-615 and conductive vias formed between the conductive layers 612-615. One or more bond pads 650 may be formed in an uppermost conductive layer 615, and the bond pads 650 may be electrically coupled to the communication circuitry 630 with conductive vias formed through the dielectric layers 616-619 and conductive traces formed between the vias in the conductive layers 612-615.

In addition, IC die 600 includes a coil 640 (e.g., one of coils 144, 154, 244, 312, 322, 412, 512, FIGS. 1-3, 5), which includes multiple substantially-concentric conductive rings 641, 642, 643 formed in one or more uppermost conductive layers 613-615 (i.e., formed proximate to surface 604 of IC die 600). For example, in the embodiment illustrated in FIG. 6, coil 640 includes conductive rings formed in the uppermost three conductive layers 613-615. The conductive rings in the various layers 613-615 are interconnected through conductive vias 644, 645 to form a continuous conductive coil having first and second ends that are electrically coupled to the communication circuitry 630. For example, a first end of the coil 640 may be coupled to the communication circuitry 630 through conductive via 646 and other conductive structures (not illustrated) between the coil 640 and the communication circuitry 630, and a second end of the coil 640 may be coupled to the communication circuitry 630 through conductive via 647 and still other conductive structures (not illustrated) between the coil 640 and the communication circuitry 630. In other embodiments, coil 640 may be formed using fewer or more than three conductive layers, and/or the ends of coil 640 may be located on a same conductive layer. In addition, vias 644, 645 shown interconnecting the concentric conductive rings 641-643 may be located in other positions, and/or multiple vias may be used to provide a plurality of cross-overs used to construct the continuous coil 640.

The uppermost dielectric layer 620 may or may not overlie the coil 640, in various embodiments. In an embodiment in which the uppermost dielectric layer 620 does overlie the coil 640 (e.g., the embodiment illustrated in FIG. 6), the height of the portion of the uppermost dielectric layer 620 overlying the coil 640 contributes to the thickness of the gap (e.g., gap thickness 352, FIG. 3) between the IC die 600 and an inductive coupling substrate (e.g., inductive coupling substrate, 160, 260, 330, 430, 530, FIGS. 1-5) that is positioned over the IC die 600. In addition, the portion of the uppermost dielectric layer 620 overlying the coil 640 may contribute to the overall level of galvanic isolation between IC 600 and the inductive coupling substrate, when arranged according to the embodiments discussed herein.

Referring also to FIGS. 1-5, embodiments of IC die 600 may be used, for example, for both the first and second IC die 140, 150 in FIG. 1, just the first IC die 240 in FIG. 2, both the first and second IC die 310, 320 in FIG. 3, both the first and second IC die 410, 420 in FIG. 4, or just the first IC die 510 in FIG. 5. When IC die 600 is incorporated into an inductive communication device (e.g., device 130, 230, 300, 400, 500, FIGS. 1-5), a wire bond (e.g., wirebond 360, 370, 460, 470, 560, FIGS. 3-5) may be coupled between the bond pad 650 and a device lead (e.g., lead 382, 384, 482, 484, 582, FIGS. 3-5). For example, bond pad 650 may correspond to a bond pad configured to receive a communication signal from external circuitry or to provide a communication signal to external circuitry (e.g., to first or second circuit 110, 120, 210, FIGS. 1, 2). In addition, the coil 640 may be aligned with a corresponding coil of an overlying inductive coupling substrate (e.g., coil 164, 166, 264, 332, 334, 432, 434, 532, FIGS. 1-5) with a dielectric structure (e.g., dielectric structure 170, 270, 350, 450, 550, FIGS. 1-5) positioned in the gap between the coils.

As discussed previously, in an embodiment of an inductive communication device in which both IC die include a coil, such as the embodiments depicted in FIGS. 1, 3, and 4, the corresponding inductive coupling substrate (e.g., inductive coupling substrates 160, 330, 430, FIGS. 1, 3, 4) includes two coils, where each of the two coils are configured to support inductive communication between a different one of the two coils in the IC die. An embodiment of such an inductive coupling substrate will now be described in the context of FIG. 7.

Figure 7:
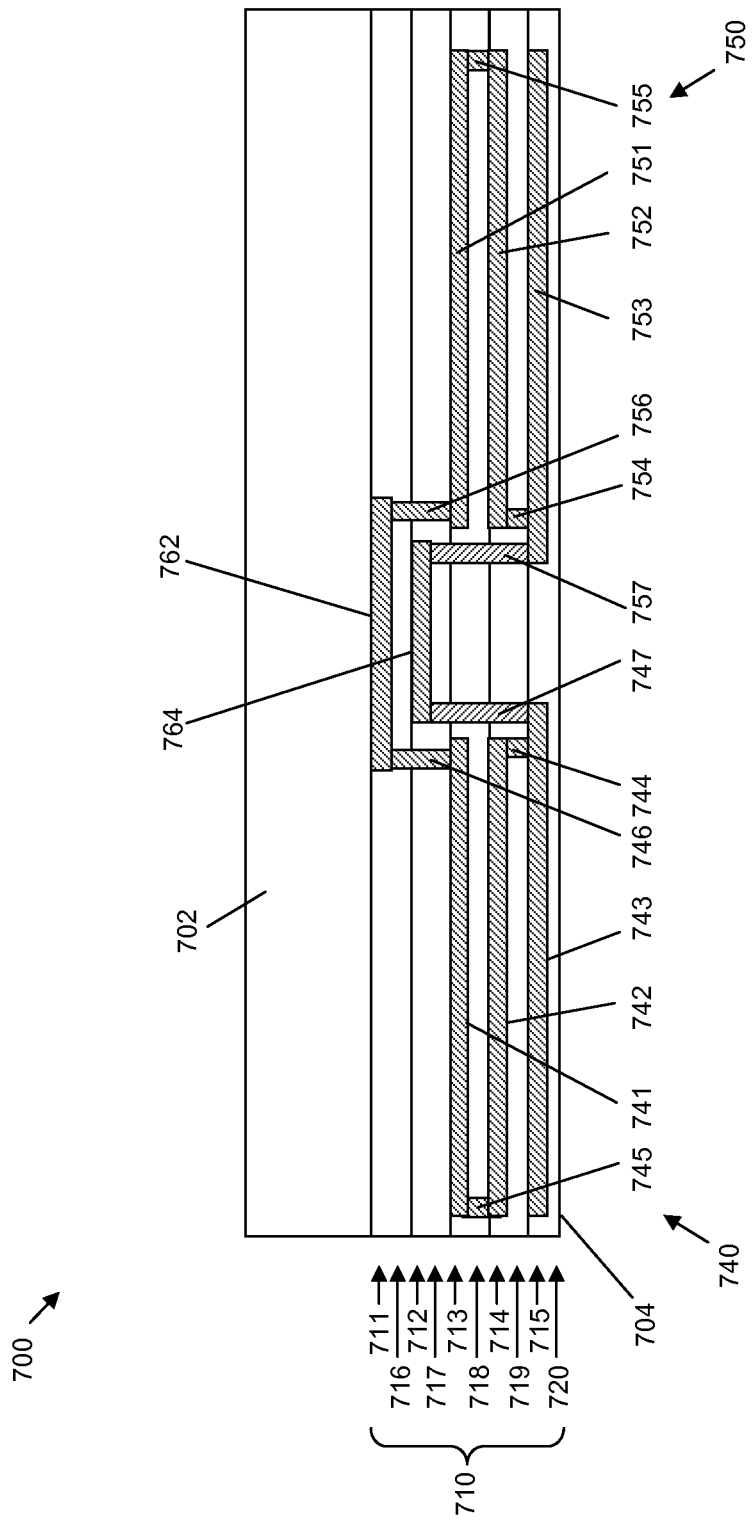
FIG. 7 is a cross-sectional, side view of an inductive coupling substrate that may be used in an inductive communication device, according to an example embodiment.

FIG. 7 is a cross-sectional, side view of an inductive coupling substrate 700 (e.g., inductive coupling substrate 160, 330, 430, FIGS. 1, 3, 4) that may be used in an inductive communication device (e.g., inductive communication devices 130, 300, 400, FIGS. 1, 3, 4), according to an example embodiment. Referring also to FIGS. 1, 3, and 4, embodiments of inductive coupling substrate 700 may be used, for example, as inductive coupling substrate 160, 330, and 430.

Inductive coupling substrate 700 includes a substrate 702, and a build-up structure 710 comprising a plurality of conductive layers 711, 712, 713, 714, 715 and dielectric layers 716, 717, 718, 719, 720 on a top surface of the substrate 702. For consistency with FIGS. 3 and 4 and enhanced understanding, inductive coupling substrate 700 is shown in the same orientation as inductive coupling substrate 330, 430 of FIGS. 3, 4 (i.e., with the surface 704 to which coils 740, 750 are proximate facing downward).

Inductive coupling substrate 700 includes two coils 740, 750 (e.g., coils 332, 334, 432, 434, FIGS. 3, 4), each of which includes multiple substantially-concentric conductive rings 741, 742, 743 and 751, 752, 753 formed in one or more uppermost conductive layers 713-715 (i.e., formed proximate to surface 704 of inductive coupling substrate 700). For example, in the embodiment illustrated in FIG. 7, each of coils 740, 750 includes conductive rings formed in the uppermost three conductive layers 713-715. The conductive rings in the various layers 713-715 are interconnected through conductive vias 744, 745, 754, 755 to form continuous conductive coils having first and second ends that are electrically coupled to each other through additional interconnections. For example, a first end of coil 740 may be coupled to a first end of coil 750 through conductive vias 746, 756 and conductive trace 762 between coil 740 and coil 750, and a second end of coil 740 may be coupled to a second end of coil 750 through conductive vias 747, 757 and conductive trace 764 between coil 740 and coil 750. In other embodiments, coils 740, 750 may be formed using fewer or more than three conductive layers, and/or the ends of coils 740, 750 may be located on a same conductive layer. In addition, vias 744, 745, 754, 755 shown interconnecting the concentric conductive rings 741-743 and 751-753 may be located in other positions, and/or multiple vias may be used to provide a plurality of cross-overs used to construct the continuous coils 740, 750. Further, the coils 740, 750 may be interconnected using different conductive structures than those depicted in FIG. 7.

The uppermost dielectric layer 720 may or may not overlie the coils 740, 750, in various embodiments. In an embodiment in which the uppermost dielectric layer 720 does overlie the coils 740, 750 (e.g., the embodiment illustrated in FIG. 7), the height of the portion of the uppermost dielectric layer 720 overlying the coils 740, 750 contributes to the thickness of the gap (e.g., gap thickness 352, FIG. 3) between the inductive coupling substrate 700 and an IC die (e.g., IC die 140, 150, 310, 320, 410, 420, FIGS. 1, 3, 4) that is positioned under the inductive coupling substrate 700. In addition, the portion of the uppermost dielectric layer 720 overlying the coils 740, 750 may contribute to the overall level of galvanic isolation between the inductive coupling substrate 700 and the IC die, when arranged according to the embodiments discussed herein.

Referring also to FIGS. 1, 3, and 4, embodiments of inductive coupling substrate 700 may be used, for example, for inductive coupling substrates 160, 330, and 430. When inductive coupling substrate 700 is incorporated into an inductive communication device (e.g., device 130, 300, 400, FIGS. 1, 3, 4), coil 740 may be aligned with a corresponding coil of an underlying first IC die (e.g., coil 144, 312, 412, of IC die 140, 310, 410, FIGS. 1, 3, 4), and coil 750 may be aligned with a corresponding coil of an underlying second IC (e.g., coil 154, 322, 422, of IC die 150, 320, 420, FIGS. 1, 3, 4) with a dielectric structure (e.g., dielectric structure 170, 350, 450, FIGS. 1, 3, 4) positioned in the gap between the coils.

Figure 8:
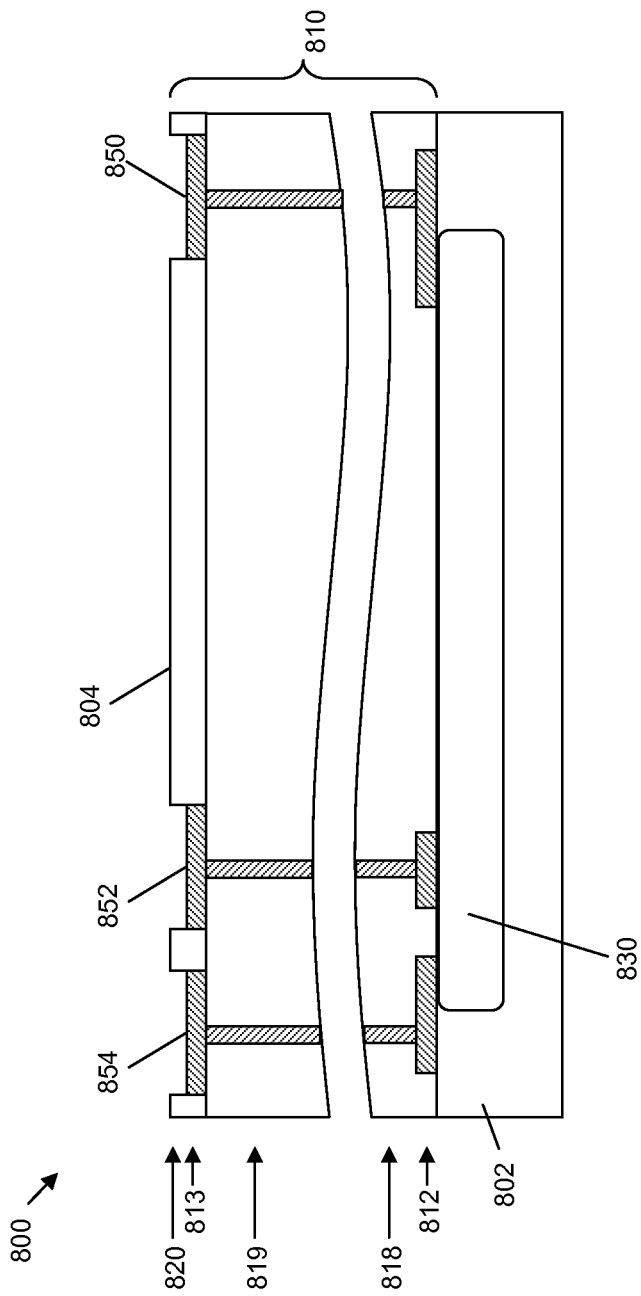
FIG. 8 is a cross-sectional, side view of another integrated circuit die that may be used in an inductive communication device, according to another example embodiment.
Figure 9:
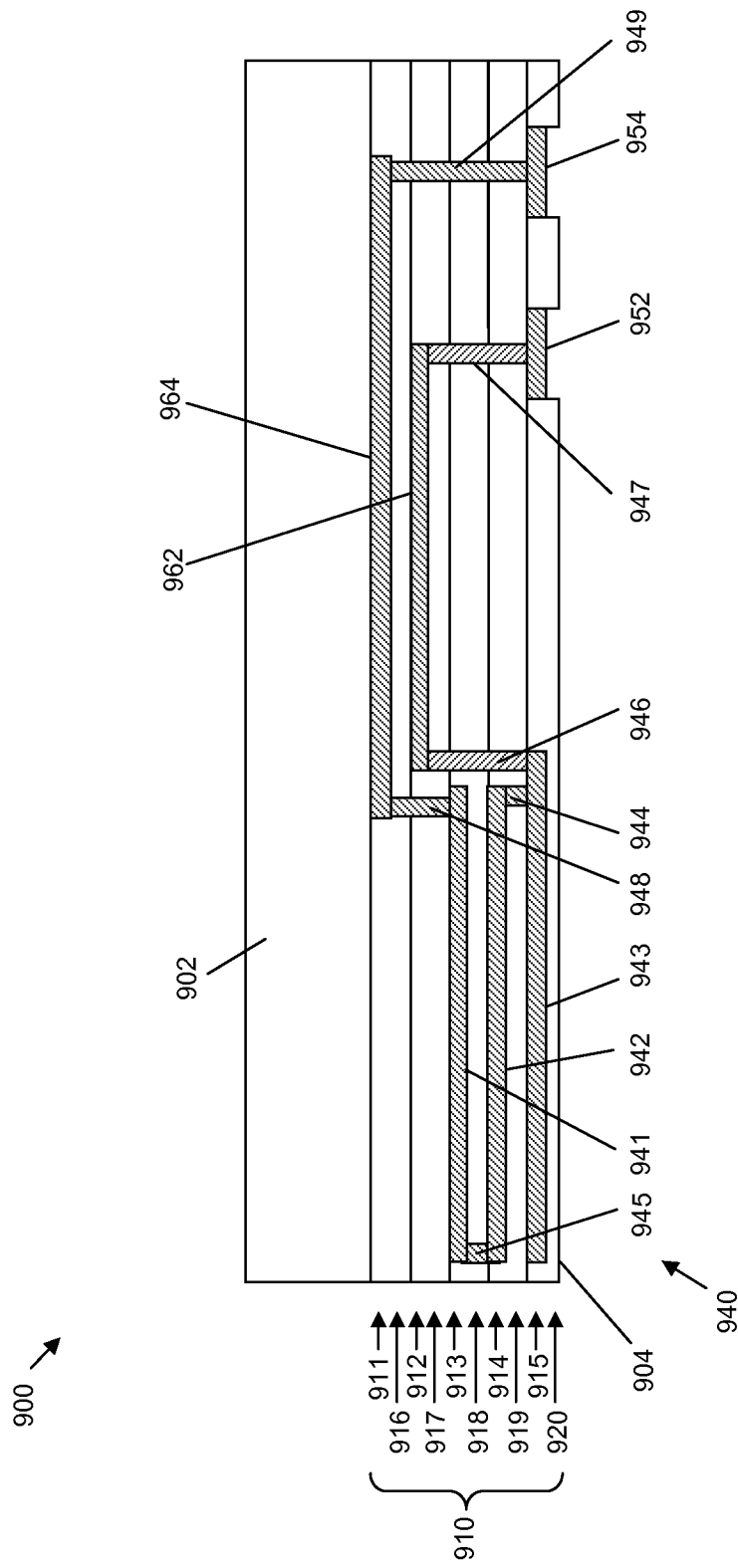
FIG. 9 is a cross-sectional, side view of another inductive coupling substrate that may be used in an inductive communication device, according to another example embodiment.

As discussed in detail above in conjunction with FIGS. 2 and 5, in some embodiments of an inductive communication device, one of the IC die (e.g., IC die 250, 520, FIGS. 2, 5) does not include a coil, but instead includes contacts (e.g., contacts 256, 258, 542, FIGS. 2, 5) that enable the IC die to communicate over a direct electrical connection (i.e., non-inductively) with an inductive coupling substrate. FIGS. 8 and 9, described in detail below, correspond to embodiments of an IC die 800 with contacts rather than a coil, and an inductive coupling substrate 900 configured to communicate with such an IC die as well as an IC die with a coil.

FIG. 8 is a cross-sectional, side view of an IC die 800 that includes contacts 852, 854, rather than a coil (e.g., IC die 250, 520, FIGS. 2, 5) that may be used in an inductive communication device (e.g., inductive communication device 230 or 500, FIGS. 2, 5), according to an example embodiment. IC die 800 includes a semiconductor substrate 802, and a build-up structure 810 comprising a plurality of conductive layers 812, 813 and dielectric layers 818, 819, 820 formed over a top surface of the semiconductor substrate 802. For consistency with FIG. 5 and enhanced understanding, IC die 800 is shown in the same orientation as IC die 520 of FIG. 5 (i.e., with the surface 804 of IC die 800 to which contacts 850, 852, 854 are proximate facing upward).

Various active components forming communication circuitry 830 are formed in the semiconductor substrate 802. For example, the communication circuitry 830 may be transmitter circuitry, receiver circuitry or transceiver circuitry, in various embodiments. The components of the communication circuitry 830 are interconnected through conductive traces formed in some or all of the conductive layers 812, 813 and conductive vias formed between the conductive layers 812, 813.

According to an embodiment, one or more bond pads 850 and one or more contacts 852, 854 (e.g., also bond pads) may be formed in conductive layer 813 proximate to (e.g., on) a surface 804 of the IC die 800. The bond pads 850 and contacts 852, 854 may be electrically coupled to the communication circuitry 830 with conductive vias extending through the build-up structure 810, along with one or more conductive traces (not shown) in intervening conductive layers.

When IC die 800 is incorporated into an inductive communication device (e.g., device 230, 500, FIGS. 2, 5), a wire bond (e.g., wirebond 570, FIG. 5) may be coupled between bond pad 850 and a device lead (e.g., lead 584, FIG. 5). For example, bond pad 850 may correspond to a bond pad configured to receive a communication signal from external circuitry or to provide a communication signal to external circuitry (e.g., second circuit 220, FIG. 2). In addition, contacts 852, 854 (e.g., contacts 256, 258, 542, FIGS. 2, 5) may be coupled to corresponding contacts (e.g., contacts 266, 268, 540, 952, 954, FIGS. 2, 5, 9) of an inductive coupling substrate (e.g., inductive coupling substrates 260, 530, 900, FIGS. 2, 5, 9) with electrical connections (e.g., electrical connection 544, FIG. 5), thus establishing conductive paths between the communication circuitry 830 and a coil (e.g., coil 264, 532, FIGS. 2, 5) of the inductive coupling substrate.

FIG. 9 is a cross-sectional, side view of another inductive coupling substrate 900 (e.g., inductive coupling substrate 260, 530, FIGS. 2, 5) that may be used in an inductive communication device (e.g., inductive communication devices 230, 500, FIGS. 2, 5), according to another example embodiment. Referring also to FIGS. 2 and 5, embodiments of inductive coupling substrate 900 may be used, for example, as inductive coupling substrate 260 and 530.

Inductive coupling substrate 900 includes a substrate 902, and a build-up structure 910 comprising a plurality of conductive layers 911, 912, 913, 914, 915 and dielectric layers 916, 917, 918, 919, 920 on a top surface of the substrate 902. For consistency with FIG. 5 and enhanced understanding, inductive coupling substrate 900 is shown in the same orientation as inductive coupling substrate 530 of FIG. 5 (i.e., with the surface 904 to which coil 940 is proximate facing downward).

Inductive coupling substrate 900 includes coil 940 (e.g., coil 264, 532, FIGS. 2, 5) and two contacts 952, 954 (e.g., contacts 266, 268, 540, FIGS. 2, 5). Coil 940 includes multiple substantially-concentric conductive rings 941, 942, 943 formed in one or more uppermost conductive layers 913-915 (i.e., formed proximate to surface 904 of inductive coupling substrate 900). For example, in the embodiment illustrated in FIG. 9, coil 940 includes conductive rings formed in the uppermost three conductive layers 913-915. The conductive rings in the various layers 913-915 are interconnected through conductive vias 944, 945 to form a continuous conductive coil having first and second ends that are electrically coupled to contacts 952, 954.

For example, a first end of coil 940 may be coupled to a first contact 952 through conductive vias 946, 947 and conductive trace 962 between coil 940 and contact 952, and a second end of coil 940 may be coupled to a second contact 954 through conductive vias 948, 949 and conductive trace 964 between coil 940 and contact 954. In other embodiments, coil 940 may be formed using fewer or more than three conductive layers, and/or the ends of coil 940 may be located on a same conductive layer. In addition, vias 944, 945 shown interconnecting the concentric conductive rings 941-943 may be located in other positions, and/or multiple vias may be used to provide a plurality of cross-overs used to construct the continuous coil

940. Further, the coil 940 and contacts 952, 954 may be interconnected using different conductive structures than those depicted in FIG. 9.

The uppermost dielectric layer 920 may or may not overlie the coil 940, in various embodiments. In an embodiment in which the uppermost dielectric layer 920 does overlie the coil 940 (e.g., the embodiment illustrated in FIG. 9), the height of the portion of the uppermost dielectric layer 920 overlying the coil 940 contributes to the thickness of the gap between the inductive coupling substrate 900 and an IC die that is positioned under the inductive coupling substrate 900 (e.g., the gap between IC die 510 and inductive coupling substrate 530, FIG. 5). In addition, the portion of the uppermost dielectric layer 920 overlying the coil 940 may contribute to the overall level of galvanic isolation between the inductive coupling substrate 900 and the IC die, when arranged according to the embodiments discussed herein.

Referring also to FIGS. 2 and 5, embodiments of inductive coupling substrate 900 may be used, for example, for inductive coupling substrates 260, 530. When inductive coupling substrate 900 is incorporated into an inductive communication device (e.g., device 230, 500, FIGS. 2, 5), coil 940 may be aligned with a corresponding coil of an underlying first IC die (e.g., coil 244, 512, of IC die 240, 510, FIGS. 2, 5) with a dielectric structure (e.g., dielectric structure 270, 550, FIGS. 2, 5) positioned in the gap between the coils. In addition, contacts 952, 954 (e.g., contacts 266, 268, 540, FIGS. 2, 5) may be coupled to corresponding contacts (e.g., contacts 256, 258, 542, 852, 854, FIGS. 2, 5, 8) of an IC die (e.g., IC die 250, 520, 800, FIGS. 2, 5, 8) with electrical connections (e.g., electrical connection 544, FIG. 5), thus establishing conductive paths between the inductive coupling substrate 900 and the IC die.

Figure 14:
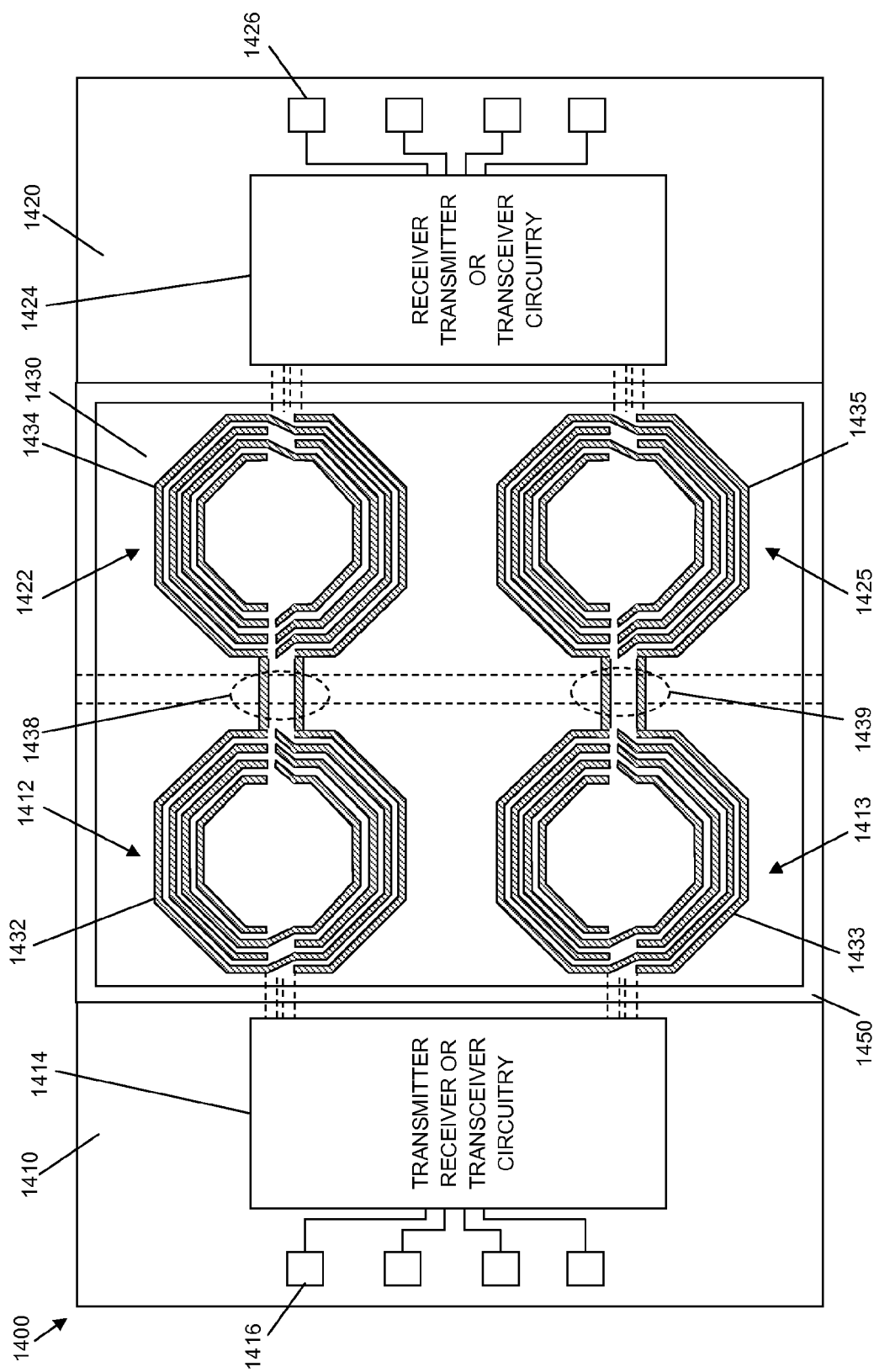
FIG. 14 is a top view of a portion of an inductive communication device, according to yet another example embodiment.
Figure 15:
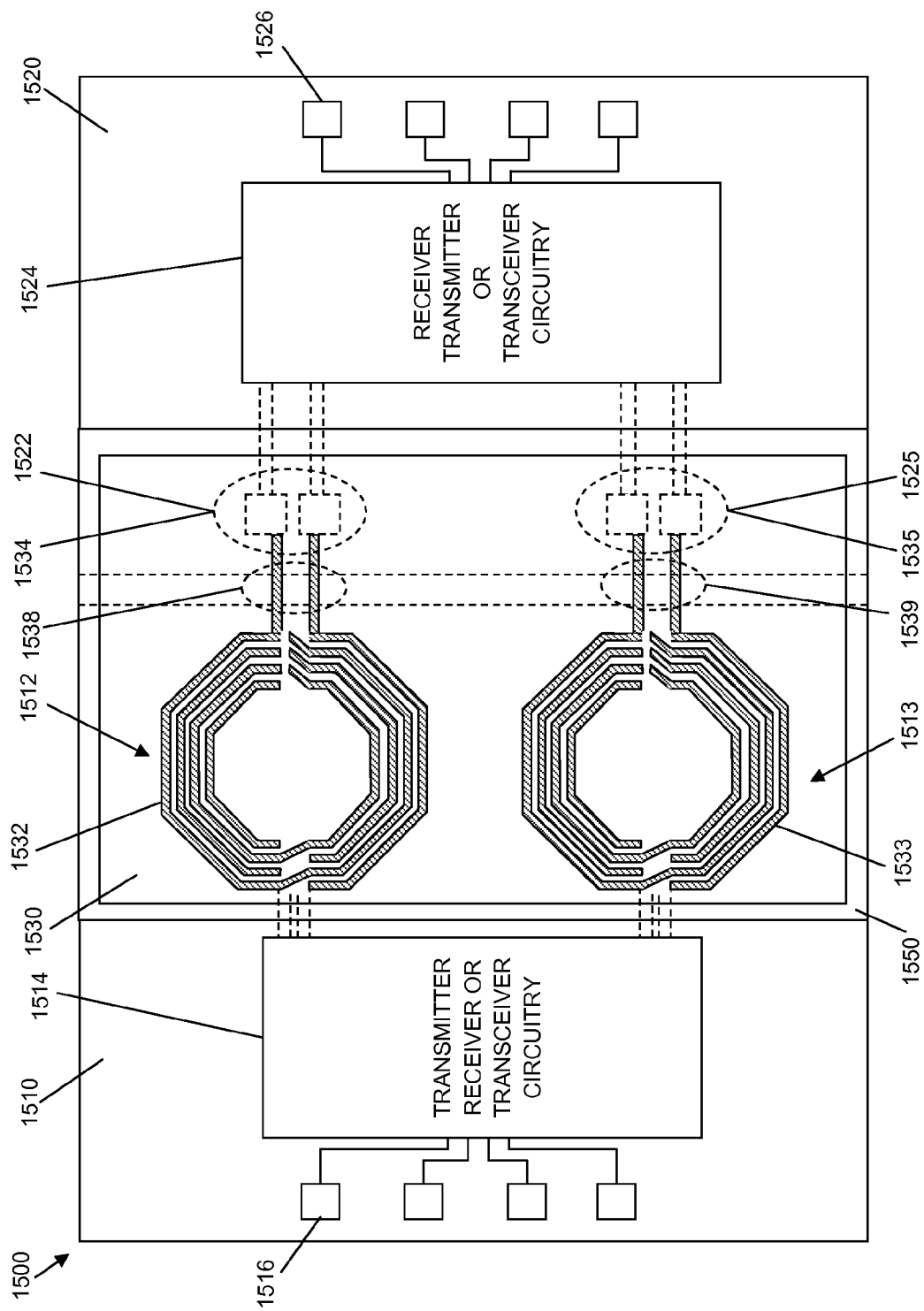
FIG. 15 is a top view of a portion of an inductive communication device, according to yet another example embodiment.

Various embodiments of arrangements of different types of IC die and inductive coupling substrates within an inductive communication device will now be described in conjunction with FIGS. 10-15. More particularly, FIGS. 10-15 depict embodiments of inductive communication devices that include a single communication path (FIGS. 10, 11), multiple parallel communication paths (FIGS. 12, 13), and a single communication path in which the input signal is split into multiple paths for inductive communication, and then recombined into a single signal after inductive communication (FIGS. 14, 15).

Figure 10:
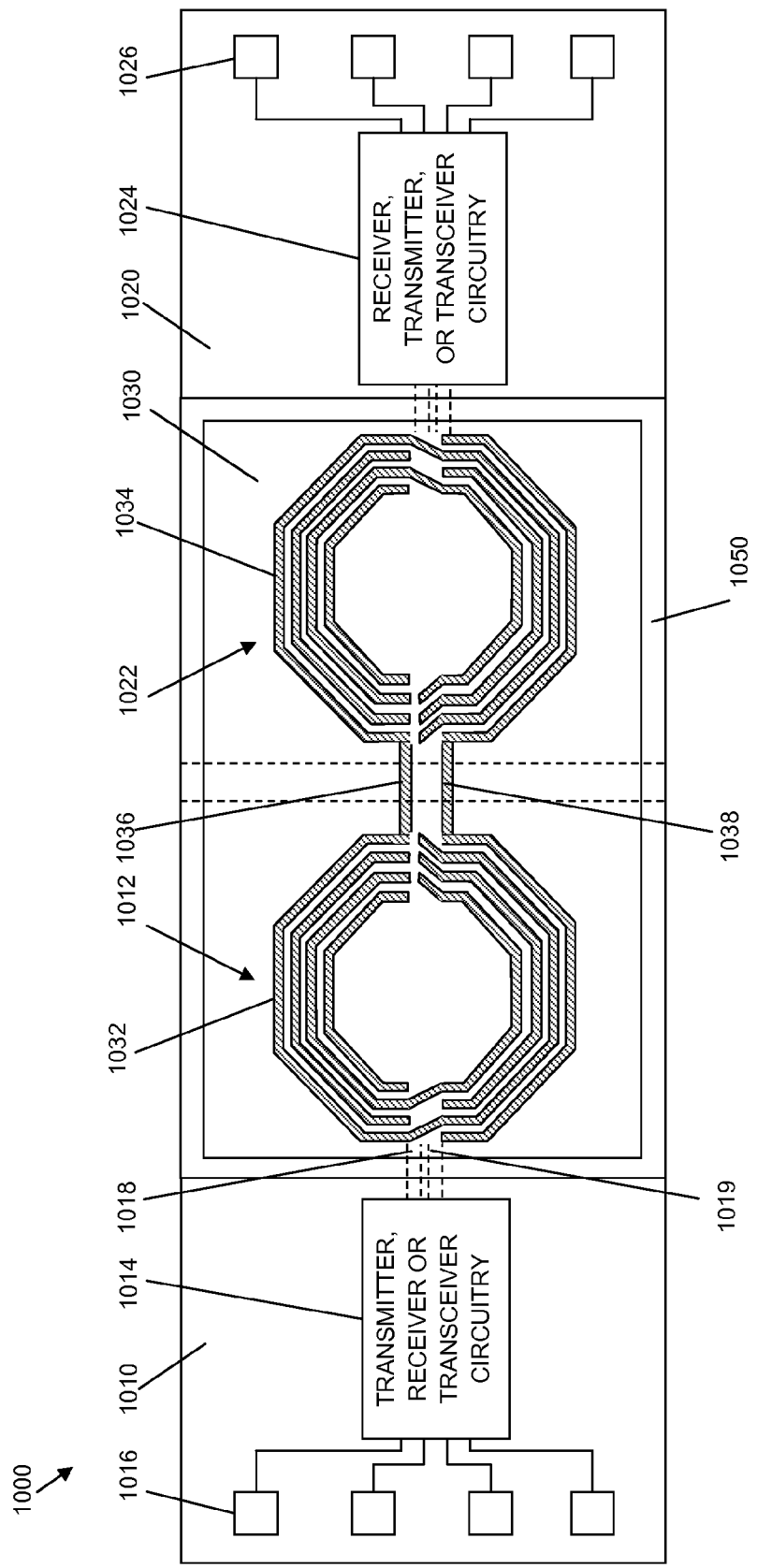
FIG. 10 is a top view of a portion of an inductive communication device, according to an example embodiment.

FIG. 10 is a top view of a portion of an inductive communication device 1000 with a single communication path that includes a two-coil inductive coupling substrate 1030, and thus two serially arranged primary/secondary coil pairs 1012, 1032 and 1022, 1034, according to an example embodiment. More particularly, FIG. 10 illustrates the top surface of a first IC die 1010 (partially obscured), a second IC die 1020 (partially obscured), and an inductive coupling substrate 1030 (overlying and partially obscuring the first and second IC die 1010, 1020). A dielectric structure 1050 with a perimeter that extends beyond the perimeter of the inductive coupling substrate 1030 is positioned in a gap (e.g., gap 180, FIG. 1) between the bottom surface of the inductive coupling substrate 1030 and the first and second IC die 1010, 1020. Except for the exclusion of leads and wirebonds, the inductive communication device 1000 may have a cross-section (along a plane that extends from left to right in FIG. 10) that is substantially similar to the cross-sectional view in FIG. 3, for example. In an embodiment in which the width of the dielectric structure 1050 were less that the width of the inductive coupling substrate 1030, the inductive communication device 1000 may have a cross-section that is substantially similar to the cross-sectional view in FIG. 4, for example.

First IC die 1010 includes a coil 1012 proximate to the top surface of the first IC die 1010, first communication circuitry 1014 (e.g., transmitter, receiver, or transceiver circuitry), and a plurality of first bond pads 1016 proximate to the top surface of the first IC die 1010. Coil 1012 consists of a continuous conductive structure (i.e., continuous between an input terminal 1018 and an output terminal 1019) that includes multiple substantially-concentric conductive rings that may be located in multiple conductive layers of the first IC die 1010. In FIG. 10, coil 1012 does not appear to consist of a continuous conductive structure between input terminal 1018 and output terminal 1019, as there are various discontinuities shown within coil 1012. The discontinuities are shown to simplify the depiction of coil 1012, and also to indicate that the coil's concentric rings may be coupled through conductive vias to concentric rings in underlying conductive layers, further conveying that the structure of coil 1012 may be a multi-layer structure that includes a plurality of cross-overs to establish a continuous conductive structure. This same depiction of coils also applies to the other coils 1022, 1032, 1034 in FIG. 10 and to the coils depicted in FIGS. 11-15.

Second IC die 1020 also includes a coil 1022 proximate to the top surface of the second IC die 1020, second communication circuitry 1024 (e.g., receiver, transmitter, or transceiver circuitry), and a plurality of second bond pads 1026 proximate to the top surface of the second IC die 1020. Coil 1022 also consists of a continuous conductive structure that includes multiple substantially-concentric conductive rings that may be located in multiple conductive layers of the second IC die 1020. Some of first and second bond pads 1016, 1026 may be used to receive voltage supplies (e.g., power and ground), and other ones of first and second bond pads 1016, 1026 may be used to receive input signals, convey output signals, receive control signals, or to convey other types of signals. Although each set of bond pads 1016, 1026 is shown to include four bond pads 1016, 1026, each IC 1010, 1020 may include more or fewer bond pads.

Also depicted in FIG. 10 is the top surface of inductive coupling substrate 1030 overlying and partially obscuring the first and second IC die 1010, 1020. The inductive coupling substrate 1030 includes two coils 1032, 1034 (not specifically apparent as the coils 1032, 1034 are substantially aligned with and overlie coils 1012, 1022, respectively), respective ends of which are electrically coupled together with conductive structures 1036, 1038.

Also depicted in FIG. 10 is dielectric structure 1050, which also is partially obscured by inductive coupling substrate 1030. As discussed previously, when arranged to provide inductive communication between coils 1012, 1032 of the first IC die 1010 and the inductive coupling substrate 1030, and further inductive communication between the inductive coupling substrate 1030 and the second IC die 1020, the surfaces of the first and second IC die 1010, 1020 to which the coils 1012, 1022 are proximate are oriented to face the surface of inductive coupling substrate 1030 to which coils 1032, 1034 are proximate. In addition, the coils 1012, 1032 are substantially aligned with each other, and coils 1022, 1034 are substantially aligned with each other across a gap (e.g., gap 180, FIG. 1), where the gap is established at least in part by the dielectric structure 1050. As shown, the dielectric structure 1050 is arranged so that it is present across the entire area of overlap of the coils 1012, 1032 and 1022, 1034. According to a further embodiment, and as mentioned above, the dielectric structure 1050 may have dimensions such that the dielectric structure 1050 extends beyond some or all of the edges of the inductive coupling substrate 1030. In another embodiment, the dielectric structure 1050 may have dimensions such that the dielectric structure 1050 does not extend beyond, but is retreated from, some or all of the edges of the inductive coupling substrate 1030.

Figure 11:
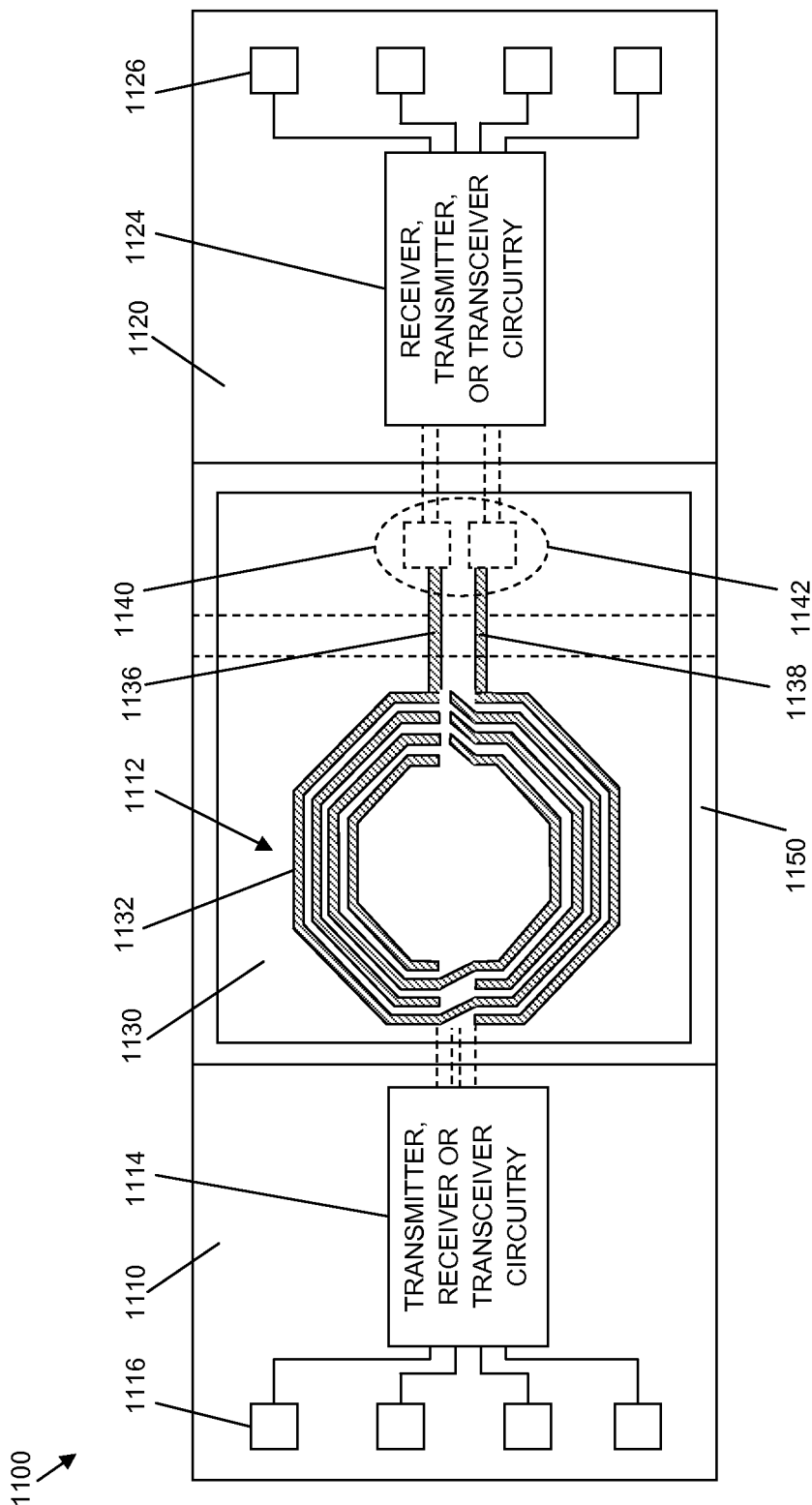
FIG. 11 is a top view of a portion of an inductive communication device, according to another example embodiment.

FIG. 11 is a top view of a portion of an inductive communication device 1100, according to another example embodiment. More particularly, FIG. 11 illustrates the top surface of a first IC die 1110 (partially obscured), a second IC die 1120 (partially obscured), and an inductive coupling substrate 1130 (overlying and partially obscuring the first and second IC die 1110, 1120). A dielectric structure 1150 with a perimeter that extends beyond the perimeter of the inductive coupling substrate 1130 is positioned in a gap (e.g., gap 280, FIG. 2) between the bottom surface of the inductive coupling substrate 1130 and at least the first IC die 1110. Except for the exclusion of leads and wirebonds, the inductive communication device 1100 may have a cross-section (along a plane that extends from left to right in FIG. 11) that is substantially similar to the cross-sectional view in FIG. 5, for example. The inductive communication device 1100 of FIG. 11 is similar to the inductive communication device 1000 of FIG. 10, except that the inductive coupling substrate 1130 has a single coil 1132 for inductively communicating with the first IC die 1110, and contacts 1140 for communicating with the second IC die 1120.

First IC die 1110 includes a coil 1112 proximate to the top surface of the first IC die 1110, first communication circuitry 1114 (e.g., transmitter, receiver, or transceiver circuitry), and a plurality of first bond pads 1116 proximate to the top surface of the first IC die 1110. Coil 1112 consists of a continuous conductive structure that includes multiple substantially-concentric conductive rings that may be located in multiple conductive layers of the first IC die 1110.

Second IC die 1120 does not include a coil, but instead includes contacts 1142 proximate to the top surface of the second IC die 1120, second communication circuitry 1124 (e.g., receiver, transmitter, or transceiver circuitry), and a plurality of second bond pads 1126 proximate to the top surface of the second IC die 1120. The contacts 1126 are electrically coupled with the contacts 1140 of the inductive coupling substrate 1130 to provide for direct electrical communication between the second IC die 1120 and the inductive coupling substrate 1130. Some of first and second bond pads 1116, 1126 may be used to receive voltage supplies (e.g., power and ground), and other ones of first and second bond pads 1116, 1126 may be used to receive input signals, convey output signals, receive control signals, or to convey other types of signals. Although each set of bond pads 1116, 1126 is shown to include four bond pads 1116, 1126, each IC 1110, 1120 may include more or fewer bond pads.

Also depicted in FIG. 11 is the top surface of inductive coupling substrate 1130 overlying and partially obscuring the first and second IC die 1110, 1120. The inductive coupling substrate 1130 includes coil 1132 (which is substantially aligned with and overlies coil 1112), and contacts 1140, which are electrically coupled to coil 1132 with conductive structures 1136, 1138.

Also depicted in FIG. 11 is dielectric structure 1150, which also is partially obscured by inductive coupling substrate 1130. As discussed previously, when arranged to provide inductive communication between coils 1112, 1132 of the first IC die 1110 and the inductive coupling substrate 1130, the surfaces of the first IC die 1110 to which the coil 1112 is proximate is oriented to face the surface of inductive coupling substrate 1130 to which coil 1132 is proximate. In addition, the coils 1112, 1132 are substantially aligned with each other across a gap (e.g., gap 280, FIG. 2), where the gap is established at least in part by the dielectric structure 1150. As shown, the dielectric structure 1150 is arranged so that it is present across the entire area of overlap of the coils 1112, 1132. According to a further embodiment, the dielectric structure 1150 may have dimensions such that the dielectric structure 1150 extends beyond some or all of the edges of the inductive coupling substrate 1130. In another embodiment, the dielectric structure 1150 may have dimensions such that the dielectric structure 1150 does not extend beyond, but is retreated from, some or all of the edges of the inductive coupling substrate 1130.

The embodiments depicted in FIGS. 10 and 11 provide for a single one-way or bi-directional communication path between first communication circuitry 1014, 1114 and second communication circuitry 1024, 1124. For example, when first communication circuitry 1014, 1114 includes transmitter circuitry and second communication circuitry 1024, 1124 includes receiver circuitry, a one-way communication path may be established from left to right in FIGS. 10 and 11. Conversely, when first communication circuitry 1014, 1114 includes receiver circuitry and second communication circuitry 1024, 1124 includes transmitter circuitry, a one-way communication path may be established from right to left in FIGS. 10 and 11. When first and second communication circuitry 1014, 1114, 1024, 1124 each include transceiver circuitry, a time-duplexed, bi-directional communication path may be established between the first and second communication circuitry 1014, 1114, 1024, 1124.

Figure 12:
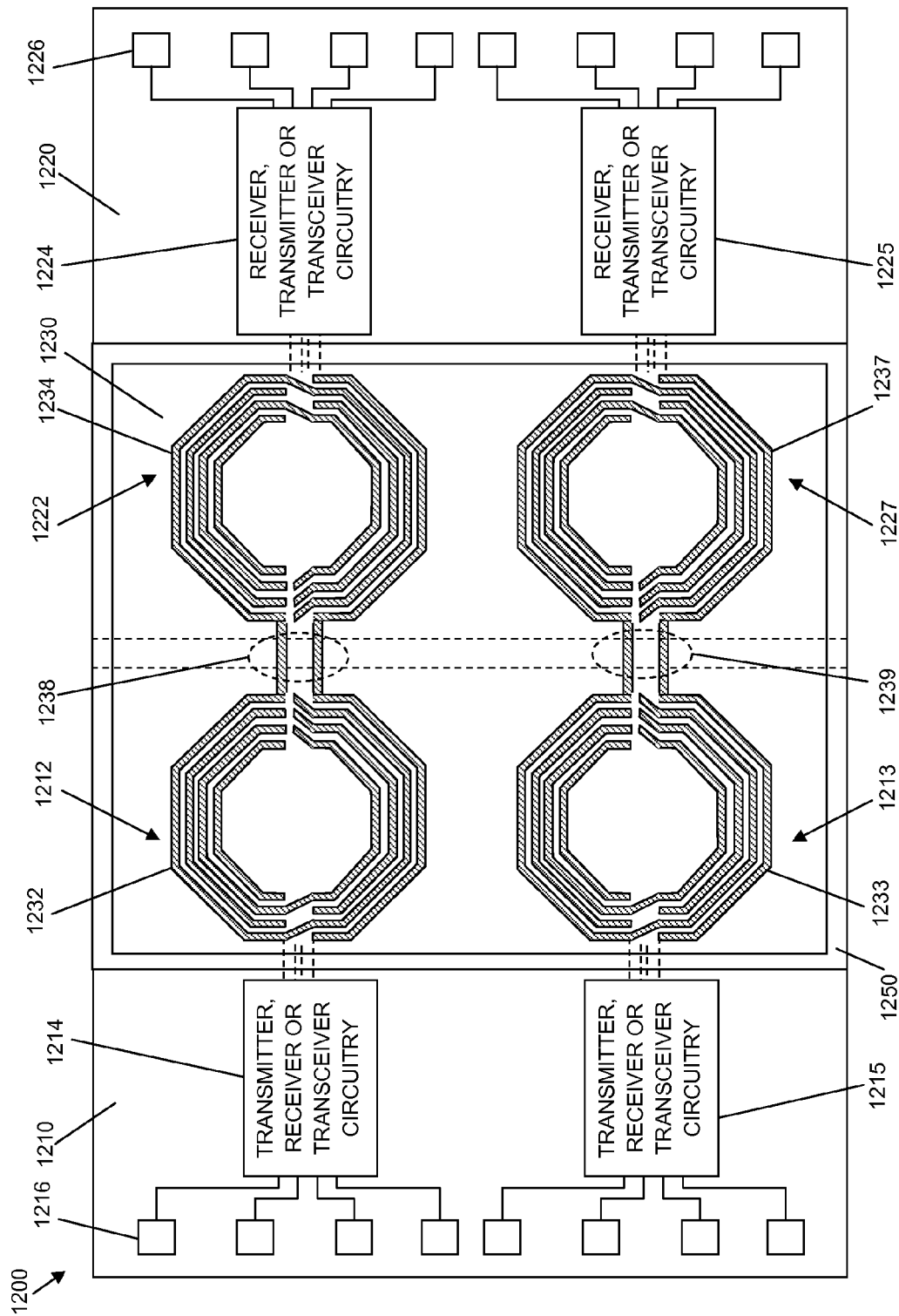
FIG. 12 is a top view of a portion of an inductive communication device, according to yet another example embodiment.

In various alternate embodiments, an inductive communication device may include multiple parallel communication paths. For example, FIG. 12 is a top view of a portion of an inductive communication device 1200 with two communications paths, each of which includes a two serially-arranged primary/secondary coil pairs (i.e., coil pairs 1212, 1232 and 1222, 1234, and coil pairs 1213, 1233 and 1227, 1237), according to another example embodiment. Similar to the embodiment depicted in FIG. 10, FIG. 12 illustrates the top surface of a first IC die 1210 (partially obscured), a second IC die 1220 (partially obscured), and an inductive coupling substrate 1230 (overlying and partially obscuring the first and second IC die 1210, 1220). A dielectric structure 1250 with a perimeter that extends beyond the perimeter of the inductive coupling substrate 1230 is positioned in a gap (e.g., gap 180, FIG. 1) between the bottom surface of the inductive coupling substrate 1230 and the first and second IC die 1210, 1220.

The first IC die 1210 includes a pair of spatially-separated coils 1212, 1213 proximate to the top surface of the first IC die 1210, first communication circuitry 1214 (e.g., transmitter, receiver, or transceiver circuitry), second communication circuitry 1215 (e.g., transmitter, receiver, or transceiver circuitry), and a plurality of first bond pads 1216. The second IC die 1220 includes a pair of spatially-separated coils 1222, 1227, third communication circuitry 1224 (e.g., receiver, transmitter, or transceiver circuitry), fourth communication circuitry 1225 (e.g., receiver, transmitter, or transceiver circuitry), and a second plurality of bond pads 1226. Some of first and second bond pads 1216, 1226 may be used to receive voltage supplies (e.g., power and ground), and other ones of first and second bond pads 1216, 1226 may be used to receive input signals, convey output signals, receive control signals, or to convey other types of signals. Although each set of first and second bond pads 1216, 1226 is shown to include eight bond pads 1216, 1216, each IC 1210, 1220 may include more or fewer bond pads.

Also depicted in FIG. 12 is the top surface of inductive coupling substrate 1230 overlying and partially obscuring the first and second IC die 1210, 1220. The inductive coupling substrate 1230 includes two spatially-separated pairs of serially-connected coils, or more specifically serially connected coils 1232, 1234 and serially-connected coils 1233, 1237. The ends of each pair of serially-connected coils are electrically coupled together with conductive structures 1238, 1239.

Also depicted in FIG. 12 is dielectric structure 1250, which also is partially obscured by inductive coupling substrate 1230. When arranged to provide inductive communication between coils 1212, 1232, 1213, 1233 of the first IC die 1210 and the inductive coupling substrate 1230, and further inductive communication between coils 1222, 1234, 1227, 1237 of the second IC die 1220 and the inductive coupling substrate 1230, the surfaces of the first and second IC die 1210, 1220 to which the coils 1212, 1213, 1222, 1227 are proximate are oriented to face the surface of inductive coupling substrate 1230 to which coils 1232, 1233, 1234, 1237 are proximate. In addition, coils 1212, 1232 are substantially aligned with each other, coils 1213, 1233 are substantially aligned with each other, coils 1222, 1234 are substantially aligned with each other, and coils 1227, 1237 are substantially aligned with each other across a gap (e.g., gap 180, FIG. 1), where the gap is established at least in part by the dielectric structure 1250. As shown, the dielectric structure 1250 is arranged so that it is present across the entire area of overlap of the coils 1212, 1232, coils 1222, 1234, coils 1213, 1233, and coils 1227, 1237. According to a further embodiment, and as mentioned above, the dielectric structure 1250 may have dimensions such that the dielectric structure 1250 extends beyond some or all of the edges of the inductive coupling substrate 1230. In another embodiment, the dielectric structure 1250 may have dimensions such that the dielectric structure 1250 does not extend beyond, but is retreated from, some or all of the edges of the inductive coupling substrate 1230.

Figure 13:
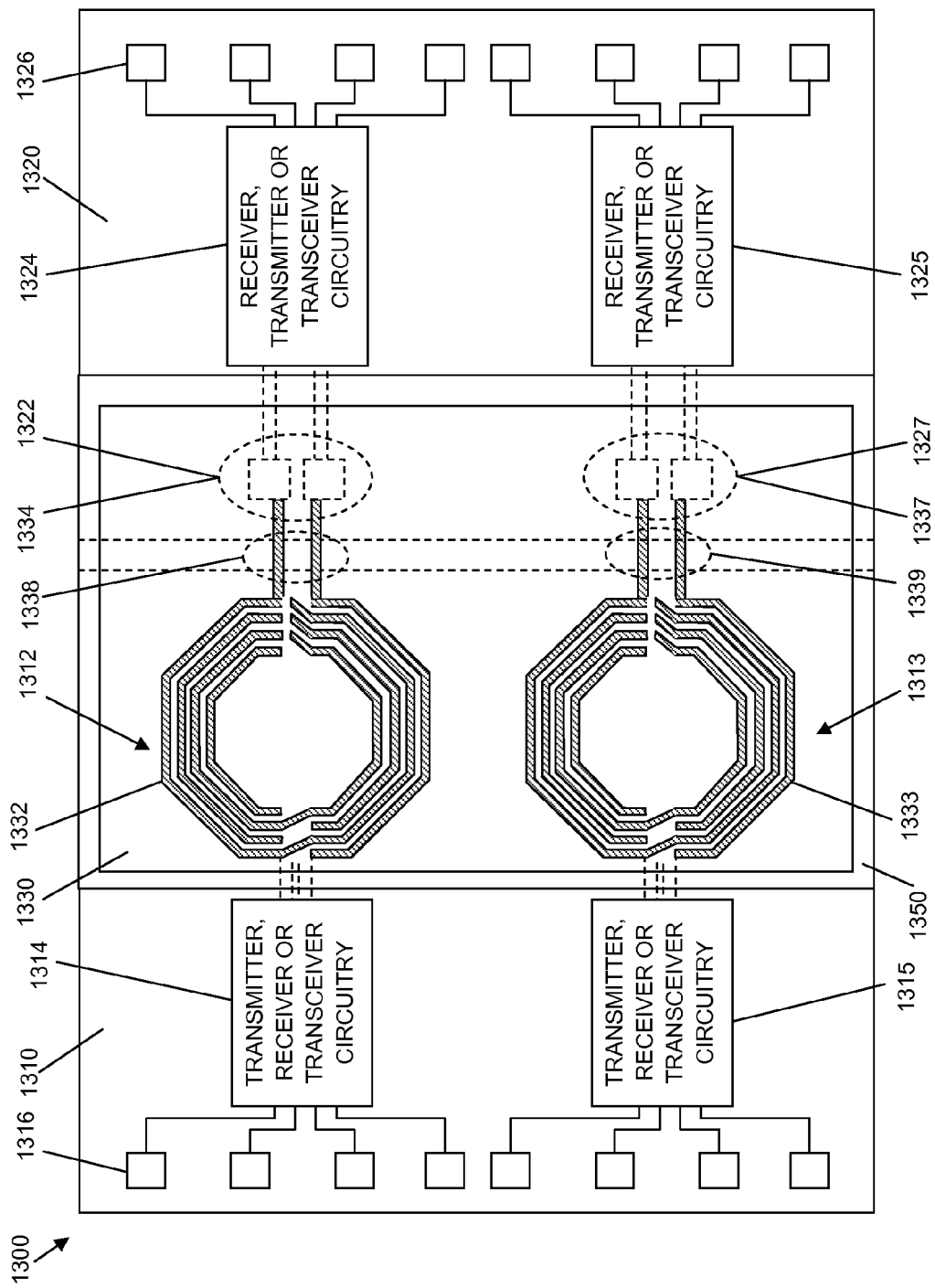
FIG. 13 is a top view of a portion of an inductive communication device, according to yet another example embodiment.

FIG. 13 is a top view of a portion of an inductive communication device 1300 with two communications paths, each of which includes a two serially-arranged primary/secondary coil pairs and contacts (i.e., coil pairs 1312, 1332 and contacts 1322, 1334, and coil pairs 1313, 1333 and contacts 1327, 1337), according to another example embodiment. Similar to the embodiment depicted in FIG. 10, FIG. 13 illustrates the top surface of a first IC die 1310 (partially obscured), a second IC die 1320 (partially obscured), and an inductive coupling substrate 1330 (overlying and partially obscuring the first and second IC die 1310, 1320). A dielectric structure 1350 with a perimeter that extends beyond the perimeter of the inductive coupling substrate 1330 is positioned in a gap (e.g., gap 280, FIG. 2) between the bottom surface of the inductive coupling substrate 1330 and at least the first IC die 1310. The inductive communication device 1300 of FIG. 13 is similar to the inductive communication device 1200 of FIG. 12, except that, along each communication path, the inductive coupling substrate 1330 has a single coil 1332, 1333 for inductively communicating with the first IC die 1310, and contacts 1334, 1337 for communicating with the second IC die 1320.

The first IC die 1310 includes a pair of spatially-separated coils 1312, 1313 proximate to the top surface of the first IC die 1310, first communication circuitry 1314 (e.g., transmitter, receiver, or transceiver circuitry), second communication circuitry 1315 (e.g., transmitter, receiver, or transceiver circuitry), and a plurality of first bond pads 1316. Second IC die 1320 does not include coils, but instead includes two sets of contacts 1322, 1327 proximate to the top surface of the second IC die 1320, third communication circuitry 1324 (e.g., receiver, transmitter, or transceiver circuitry), fourth communication circuitry 1325 (e.g., receiver, transmitter, or transceiver circuitry), and a plurality of second bond pads 1326 proximate to the top surface of the second IC die 1320. The contacts 1322, 1327 are electrically coupled with corresponding sets of contacts 1334, 1337 of the inductive coupling substrate 1330 to provide for direct electrical communication between the second IC die 1320 and the inductive coupling substrate 1330. Some of first and second bond pads 1316, 1326 may be used to receive voltage supplies (e.g., power and ground), and other ones of first and second bond pads 1316, 1326 may be used to receive input signals, convey output signals, receive control signals, or to convey other types of signals. Although each set of bond pads 1316, 1326 is shown to include eight bond pads 1316, 1326, each IC 1310, 1320 may include more or fewer bond pads.

Also depicted in FIG. 13 is the top surface of inductive coupling substrate 1330 overlying and partially obscuring the first and second IC die 1310, 1320. The inductive coupling substrate 1330 includes a pair of spatially-separated coils 1332, 1333 (which are substantially aligned with and overlie coils 1312, 1313), and two sets of contacts 1334, 1337. The ends of each of the coils 1332, 1333 are electrically coupled with one of the sets of contacts 1334, 1337 with conductive structures 1338, 1339.

Also depicted in FIG. 13 is dielectric structure 1350, which also is partially obscured by inductive coupling substrate 1330. When arranged to provide inductive communication between coils 1312, 1332, 1313, 1333 of the first IC die 1310 and the inductive coupling substrate 1330, the surface of at least the first IC die 1310 to which the coils 1312, 1313 are proximate is oriented to face the surface of inductive coupling substrate 1330 to which coils 1332, 1333 are proximate. In addition, coils 1312, 1332 are substantially aligned with each other, and coils 1313, 1333 are substantially aligned with each other across a gap (e.g., gap 280, FIG. 2), where the gap is established at least in part by the dielectric structure 1350. As shown, the dielectric structure 1350 is arranged so that it is present across the entire area of overlap of the coils 1312, 1332 and 1313, 1333. According to a further embodiment, and as mentioned above, the dielectric structure 1350 may have dimensions such that the dielectric structure 1350 extends beyond some or all of the edges of the inductive coupling substrate 1330. In another embodiment, the dielectric structure 1350 may have dimensions such that the dielectric structure 1350 does not extend beyond, but is retreated from, some or all of the edges of the inductive coupling substrate 1330.

The embodiments depicted in FIGS. 12 and 13 provide for two, one-way communication paths. More specifically, referring first to FIG. 12, a first one-way communication path may be established from left to right in FIG. 12, or more specifically from bond pads 1216 through transmitter circuitry 1214, coils 1212, 1232, 1234, 1222, receiver circuitry 1224, and bond pads 1226. In addition, a second one-way communication path may be established from right to left in FIG. 12, or more specifically from bond pads 1226, transmitter circuitry 1225, coils 1227, 1237, 1233, 1213, receiver circuitry 1215, and bond pads 1216. Referring now to FIG. 13, a first one-way communication path may be established from left to right in FIG. 13, or more specifically from bond pads 1316 through transmitter circuitry 1314, coils 1312, 1332, contacts 1334, 1322, receiver circuitry 1324, and bond pads 1326. In addition, a second one-way communication path may be established from right to left in FIG. 13, or more specifically from bond pads 1326, transmitter circuitry 1325, contacts 1327, 1337, coils 1333, 1313, receiver circuitry 1315, and bond pads 1316. With the first and second communication paths being in opposite directions, the embodiments of FIGS. 12 and 13 each may essentially function as a transceiver.

The embodiments of inductive communication devices 1000, 1100 of FIGS. 10, 11 provide for a single communication path through the entire inductive communication device 1000, 1100. Conversely, the embodiments of inductive communication devices 1200, 1300 of FIGS. 12, 13 provide for multiple parallel communication paths within an inductive communication device 1200, 1300. In various embodiments, the inductive communication devices 1200, 1300 of FIGS. 12 and 13 may support one-way parallel communication paths (in the same direction or in opposite directions) or bi-directional parallel communication paths depending on whether each instance of the communication circuitry 1214, 1215, 1224, 1225, 1314, 1315, 1324, 1325 is designed to be transmitter circuitry, receiver circuitry, or transceiver circuitry. Alternate embodiments of inductive communication devices (e.g., inductive communication devices 1400, 1500) may include a single communication path in which the input signal is split, within the device, into multiple paths for inductive communication, and then recombined into a single signal after inductive communication.

For example, FIG. 14 is a top view of a portion of an inductive communication device 1400 with a single communications path in which the input signal is split, within the device, into multiple paths for inductive communication, and then recombined into a single signal after inductive communication, according to yet another example embodiment. Similar to the embodiments depicted in FIGS. 10-13, FIG. 14 illustrates the top surface of a first IC die 1410 (partially obscured), a second IC die 1420 (partially obscured), and an inductive coupling substrate 1430 (overlying and partially obscuring the first and second IC die 1410, 1420). A dielectric structure 1450 with a perimeter that extends beyond the perimeter of the inductive coupling substrate 1430 is positioned in a gap (e.g., gap 180, FIG. 1) between the bottom surface of the inductive coupling substrate 1430 and the first and second IC die 1410, 1420.

The first IC die 1410 includes first and second, spatially-separated coils 1412, 1413 proximate to the top surface of the first IC die 1410, communication circuitry 1414 (e.g., transmitter, receiver or transceiver circuitry), and a plurality of first bond pads 1416. The second IC die 1420 includes third and fourth, spatially-separated coils 1422, 1425, communication circuitry 1424 (e.g., receiver, transmitter or transceiver circuitry), and a second plurality of bond pads 1426. Some of first and second bond pads 1416, 1426 may be used to receive voltage supplies (e.g., power and ground), and other ones of first and second bond pads 1416, 1426 may be used to receive input signals, convey output signals, receive control signals, or to convey other types of signals. Although each set of first and second bond pads 1416, 1426 is shown to include four bond pads 1416, 1416, each IC 1410, 1420 may include more or fewer bond pads.

Also depicted in FIG. 14 is the top surface of inductive coupling substrate 1430 overlying and partially obscuring the first and second IC die 1410, 1420. The inductive coupling substrate 1430 includes two spatially-separated pairs of serially-connected coils, or more specifically serially connected coils 1432, 1434 and serially-connected coils 1433, 1435. The ends of each pair of serially-connected coils are electrically coupled together with conductive structures 1438, 1439.

Also depicted in FIG. 14 is dielectric structure 1450, which also is partially obscured by inductive coupling substrate 1430. When arranged to provide inductive communication between coils 1412, 1432, 1413, 1433 of the first IC die 1410 and the inductive coupling substrate 1430, and further inductive communication between coils 1422, 1434, 1425, 1435 of the second IC die 1420 and the inductive coupling substrate 1430, the surfaces of the first and second IC die 1410, 1420 to which the coils 1412, 1413, 1422, 1425 are proximate are oriented to face the surface of inductive coupling substrate 1430 to which coils 1432, 1433, 1434, 1435 are proximate. In addition, coils 1412, 1432 are substantially aligned with each other, coils 1413, 1433 are substantially aligned with each other, coils 1422, 1434 are substantially aligned with each other, and coils 1425, 1435 are substantially aligned with each other across a gap (e.g., gap 180, FIG. 1), where the gap is established at least in part by the dielectric structure 1450. As shown, the dielectric structure 1450 is arranged so that it is present across the entire area of overlap of the coils 1412, 1432, coils 1422, 1434, coils 1413, 1433, and coils 1425, 1435. According to a further embodiment, and as mentioned above, the dielectric structure 1450 may have dimensions such that the dielectric structure 1450 extends beyond some or all of the edges of the inductive coupling substrate 1430. In another embodiment, the dielectric structure 1450 may have dimensions such that the dielectric structure 1450 does not extend beyond, but is retreated from, some or all of the edges of the inductive coupling substrate 1430.

FIG. 15 is a top view of a portion of an inductive communication device 1500 with a single communications path in which the input signal is split, within the device, into multiple paths for inductive communication, and then recombined into a single signal after inductive communication, according to yet another example embodiment. Similar to the embodiments depicted in FIGS. 10-14, FIG. 15 illustrates the top surface of a first IC die 1510 (partially obscured), a second IC die 1520 (partially obscured), and an inductive coupling substrate 1530 (overlying and partially obscuring the first and second IC die 1510, 1520). A dielectric structure 1550 with a perimeter that extends beyond the perimeter of the inductive coupling substrate 1530 is positioned in a gap (e.g., gap 280, FIG. 2) between the bottom surface of the inductive coupling substrate 1530 and at least the first IC die 1510. The inductive communication device 1500 of FIG. 15 is similar to the inductive communication device 1400 of FIG. 14, except that the inductive coupling substrate 1530 has a pair of spatially-separated coils 1532, 1533 for inductively communicating with the first IC die 1510, and contacts 1534, 1535 for communicating with the second IC die 1520.

The first IC die 1510 includes first and second, spatially-separated coils 1512, 1513 proximate to the top surface of the first IC die 1510, communication circuitry 1514 (e.g., transmitter, receiver or transceiver circuitry), and a plurality of first bond pads 1516. Second IC die 1520 does not include coils, but instead includes two sets of contacts 1522, 1525 proximate to the top surface of the second IC die 1520, communication circuitry 1524 (e.g., receiver, transmitter or transceiver circuitry), and a plurality of second bond pads 1526 proximate to the top surface of the second IC die 1520. The contacts 1522, 1525 are electrically coupled with corresponding sets of contacts 1534, 1535 of the inductive coupling substrate 1530 to provide for direct electrical communication between the second IC die 1520 and the inductive coupling substrate 1530. Some of first and second bond pads 1516, 1526 may be used to receive voltage supplies (e.g., power and ground), and other ones of first and second bond pads 1516, 1526 may be used to receive input signals, convey output signals, receive control signals, or to convey other types of signals. Although each set of bond pads 1516, 1526 is shown to include four bond pads 1516, 1526, each IC 1510, 1520 may include more or fewer bond pads.

Also depicted in FIG. 15 is the top surface of inductive coupling substrate 1530 overlying and partially obscuring the first and second IC die 1510, 1520. The inductive coupling substrate 1530 includes a pair of spatially-separated coils 1532, 1533 (which are substantially aligned with and overlie coils 1512, 1513), and two sets of contacts 1534, 1535. The ends of each of the coils 1532, 1533 are electrically coupled with one of the sets of contacts 1534, 1535 with conductive structures 1538, 1539.

Also depicted in FIG. 15 is dielectric structure 1550, which also is partially obscured by inductive coupling substrate 1530. When arranged to provide inductive communication between coils 1512, 1532, 1513, 1533 of the first IC die 1510 and the inductive coupling substrate 1530, the surface of at least the first IC die 1510 to which the coils 1512, 1513 are proximate is oriented to face the surface of inductive coupling substrate 1530 to which coils 1532, 1533 are proximate. In addition, coils 1512, 1532 are substantially aligned with each other, and coils 1513, 1533 are substantially aligned with each other across a gap (e.g., gap 280, FIG. 2), where the gap is established at least in part by the dielectric structure 1550. As shown, the dielectric structure 1550 is arranged so that it is present across the entire area of overlap of the coils 1512, 1532 and 1513, 1533. According to a further embodiment, and as mentioned above, the dielectric structure 1550 may have dimensions such that the dielectric structure 1550 extends beyond some or all of the edges of the inductive coupling substrate 1530. In another embodiment, the dielectric structure 1550 may have dimensions such that the dielectric structure 1550 does not extend beyond, but is retreated from, some or all of the edges of the inductive coupling substrate 1530.

The embodiments depicted in FIGS. 14 and 15 provide for a single one-way or bi-directional communication path in which an input signal is split, within the device, into multiple paths for inductive communication, and then recombined into a single signal after inductive communication. More specifically, referring first to FIG. 14, when communication circuitry 1414 includes either transmitter or transceiver circuitry and communication circuitry 1424 includes either receiver or transceiver circuitry, a communication path may be established from left to right in FIG. 14, or more specifically from bond pads 1416 through communication circuitry 1414, which divides the input signal into multiple parallel paths. One instance of the divided signal is then communicated through coils 1412, 1432, 1434, 1422, and the other instance of the divided signal is communicated through coils 1413, 1433, 1435, 1425. Receiver or transceiver circuitry 1424 receives and combines the inductively communicated signals, and provides the combined signal to bond pads 1426. When communication circuitry 1424 includes either transmitter or transceiver circuitry and communication circuitry 1414 includes either receiver or transceiver circuitry, a similar communication path may be established from right to left in FIG. 14.

Referring now to FIG. 15, when communication circuitry 1514 includes either transmitter or transceiver circuitry and communication circuitry 1524 includes either receiver or transceiver circuitry, a communication path may be established from left to right in FIG. 15, or more specifically from bond pads 1516 through communication circuitry 1514, which divides the input signal into multiple parallel paths. One instance of the divided signal is then communicated through coils 1512, 1532 and contacts 1534, 1522, and the other instance of the divided signal is communicated through coils 1513, 1533 and contacts 1535, 1525. Receiver or transceiver circuitry 1524 receives and combines the inductively communicated signals, and provides the combined signal to bond pads 1526. When communication circuitry 1524 includes either transmitter or transceiver circuitry and communication circuitry 1514 includes either receiver or transceiver circuitry, a similar communication path may be established from right to left in FIG. 15.

Each of the example embodiments illustrated in FIGS. 10-15 depict one or two communication paths, where each communication path provides for inductive communication using one or more primary/secondary coil pairs. Other embodiments may include more than two one-way communication paths in a particular direction (e.g., one IC die may include multiple instantiations of transmitter circuitry and corresponding primary coils and the other IC die may include the same number of instantiations of secondary coils and corresponding receiver circuitry). Still other embodiments may include more than two one-way communication paths in both directions (e.g., each IC die may include multiple instantiations of both transmitter and receiver circuitry and corresponding primary and secondary coils). Still other embodiments may include more than two bi-directional communication paths (e.g., each IC die may include multiple instantiations of transceiver circuitry and corresponding primary and secondary coils). Such embodiments are encompassed within the scope of the inventive subject matter.

In addition, in FIGS. 10-15, each coil is depicted as four concentric, hexagonal conductive rings. In other embodiments, the conductive rings comprising a coil may have different shapes, and/or different numbers of concentric rings. In addition, as discussed previously, each coil may be formed using concentric rings within multiple conductive layers (e.g., as depicted in FIGS. 6, 7, and 9). In other embodiments, each coil may be formed using concentric rings within a different number of conductive layers from the illustrated and described embodiments.

In the embodiments depicted in FIGS. 3-15, various relative orientations of coils, communication circuitry, and bond pads are conveyed. More particularly, in each of the embodiments depicted in FIGS. 3-15, the coils, communication circuitry, and bond pads are shown to be positioned in spatially separated portions of the respective IC die or inductive coupling substrates. It should be understood that, in alternate embodiments, the communication circuitry and bond pads of an IC die may be positioned in any suitable position with respect to the coil(s) of that IC die. For example, but not by way of limitation, all or portions of the communication circuitry and/or bond pads may be placed below and/or in the center of a coil in an IC die. Any suitable relative orientation of coils, communication circuitry, and bond pads is intended to be included within the scope of the inventive subject matter.

Figure 16:
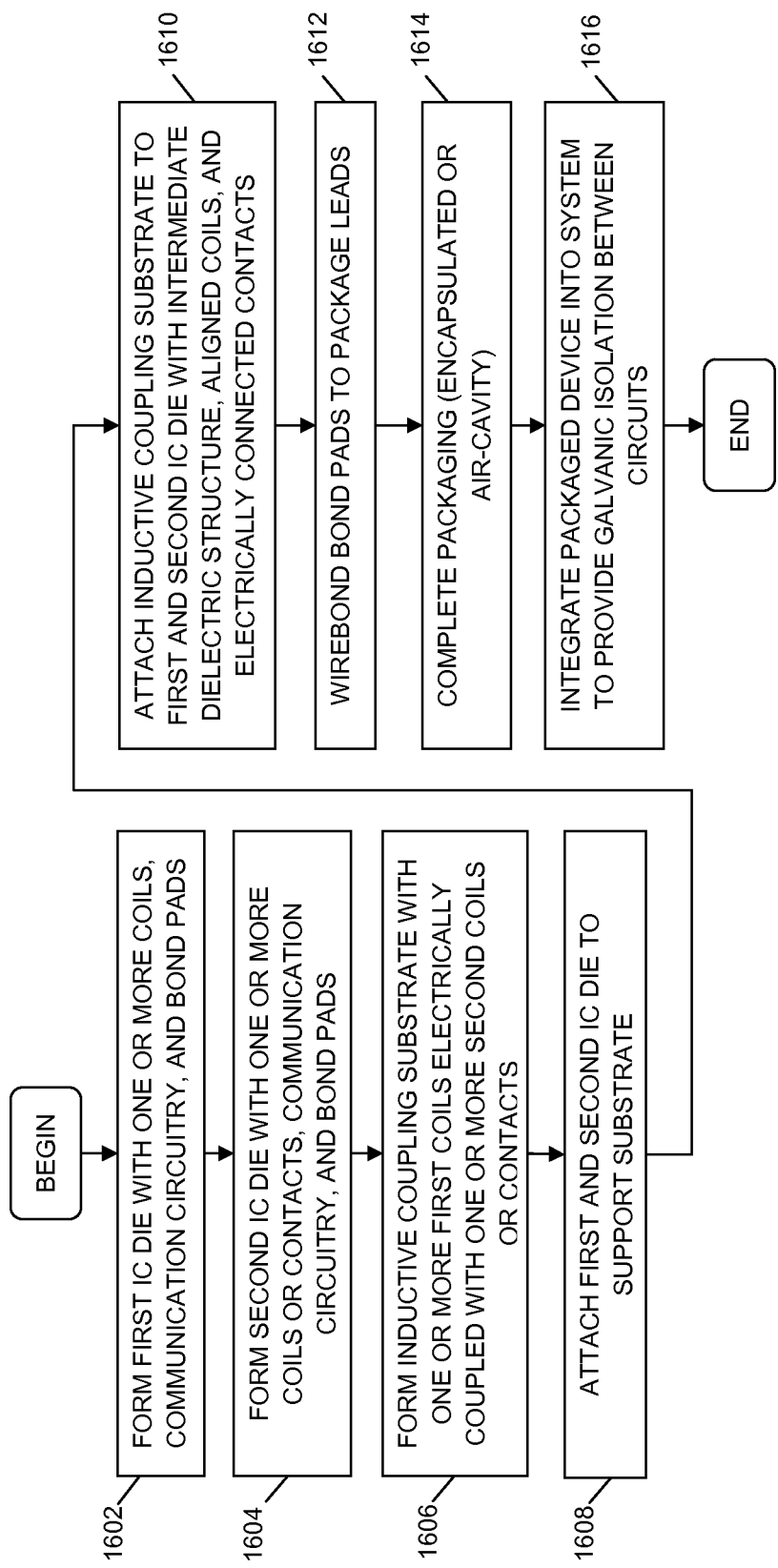
FIG. 16 is a flowchart of a method for manufacturing an inductive communication device, according to an example embodiment.

FIG. 16 is a flowchart of a method for manufacturing IC die (e.g., IC die 140, 150, 240, 250, 310, 320, 410, 420, 510, 520, 600, 800, 1010, 1020, 1110, 1120, 1310, 1320, 1410, 1420, 1510, 1520), inductive coupling substrates (e.g., inductive coupling substrates 160, 260, 330, 430, 530, 700, 900, 1030, 1130, 1230, 1430, 1530) and corresponding inductive communication devices (e.g., devices 300, 400, 500, 1000, 1100, 1200, 1300, 1400, 1500), according to various example embodiments.

The method may begin, in blocks 1602 and 1604, by forming first and second IC die (e.g., IC die 140, 150, 240, 250, 310, 320, 410, 420, 510, 520, 600, 800, 1010, 1020, 1110, 1120, 1310, 1320, 1410, 1420, 1510, 1520) for inclusion in the inductive communication device. For example, formation of the first IC die (block 1602) may include forming various components associated with one or more instantiations of transmitter, receiver, and/or transceiver circuitry (e.g., communication circuitry 630, FIG. 6) within an integrated circuit substrate (e.g., substrate 602, FIG. 6). In addition, a build-up structure (e.g., structure 610, FIG. 6) may be formed on a top surface of the semiconductor substrate, where the build-up structure includes a plurality of patterned conductive layers (e.g., layers 612-615, FIG. 6) and dielectric layers (e.g., layers 616-620, FIG. 6). During formation of the build-up structure, the plurality of conductive layers may be patterned to form conductive traces, and conductive vias may be formed through the dielectric layers between conductive layers to provide for electrical communication between the layers. In addition, during formation of the build-up structure, one or more coils (e.g., coil 640, FIG. 6), each of which includes multiple substantially-concentric conductive rings, may be formed using one or more of the uppermost conductive layers of the build-up structure (e.g., using layers 613-615, FIG. 6). A plurality of bond pads (e.g., bond pad 650, FIG. 6) may be formed in an uppermost conductive layer to provide for electrical connectivity with the communication circuitry.

Formation of the second IC die may be substantially the same as formation of the first IC die in embodiments in which the second IC die also includes coils for inductively communicating with an inductive coupling substrate (e.g., the embodiments depicted in FIGS. 1, 3, 4, 10, 12, and 14). Alternatively, in embodiments in which the second IC die includes contacts for communicating with an inductive coupling substrate (e.g., the embodiments depicted in FIGS. 2, 5, 11, 13, and 15), formation of the second IC die (block 1604) may include forming various components associated with one or more instantiations of transmitter, receiver, and/or transceiver circuitry (e.g., communication circuitry 830, FIG. 8) within an integrated circuit substrate (e.g., substrate 802, FIG. 8). In addition, a build-up structure (e.g., structure 810, FIG. 8) may be formed on a top surface of the semiconductor substrate, where the build-up structure includes a plurality of patterned conductive layers (e.g., layers 812, 813, FIG. 8) and dielectric layers (e.g., layers 818-820, FIG. 8). During formation of the build-up structure, an uppermost conductive layer (e.g., layer 813, FIG. 8) may be patterned to provide contacts (e.g., contacts 852, 854, FIG. 8) and bond pads (e.g., bond pad 850, FIG. 8), and conductive vias may be formed through the dielectric layers between conductive layers to provide for electrical communication between the contacts and bond pads and the communication circuitry.

In block 1606, an inductive coupling substrate (e.g., inductive coupling substrate 160, 260, 330, 430, 530, 700, 900, 1030, 1130, 1230, 1330, 1430, 1530) may be formed. In embodiments in which the inductive coupling substrate inductively communicates with both the first and second IC die (e.g., the embodiments depicted in FIGS. 1, 3, 4, 10, 12, and 14), formation of the inductive coupling substrate may include forming a build-up structure (e.g., structure 710, FIG. 7) on a top surface of a substrate (e.g., substrate 702, FIG. 7), where the build-up structure includes a plurality of patterned conductive layers (e.g., layers 711-715, FIG. 7) and dielectric layers (e.g., layers 716-720, FIG. 7). During formation of the build-up structure, the plurality of conductive layers may be patterned to form conductive traces, and conductive vias may be formed through the dielectric layers between conductive layers to provide for electrical communication between the layers. In addition, during formation of the build-up structure, multiple coils (e.g., coils 740, 750, FIG. 7), each of which includes multiple substantially-concentric conductive rings, may be formed using one or more of the uppermost conductive layers of the build-up structure (e.g., using layers 713-715, FIG. 7). Electrical connections (e.g., electrical connections 762, 764, FIG. 7) also may be formed to provide for electrical connectivity between the coils.

Alternatively, in embodiments in which the inductive coupling substrate communicates inductively with the first IC die and communicates with the second IC die over a direct electrical connection with the second IC die (e.g., the embodiments depicted in FIGS. 2, 5, 11, 13, and 15), formation of the inductive coupling substrate may include forming a build-up structure (e.g., structure 910, FIG. 9) on a top surface of a substrate (e.g., substrate 902, FIG. 9, where the build-up structure includes a plurality of patterned conductive layers (e.g., layers 911-915, FIG. 9) and dielectric layers (e.g., layers 916-920, FIG. 9). During formation of the build-up structure, one or more coils (e.g., coil 940, FIG. 9), which includes multiple substantially-concentric conductive rings, may be formed using one or more of the uppermost conductive layers of the build-up structure (e.g., using layers 913-915, FIG. 9). In addition, an uppermost conductive layer (e.g., layer 915, FIG. 9) may be patterned to provide contacts (e.g., contacts 952, 954, FIG. 9). Electrical connections (e.g., electrical connections 962, 964, FIG. 9) also may be formed to provide for electrical connectivity between the coil(s) and the contacts.

According to an embodiment, in block 1608, the first and second IC die may be attached (e.g., using die attach material) to a support substrate (e.g., support substrate 390, 490, 590, FIGS. 3-5). For example, the support substrate may form a portion of a leadframe that also includes a plurality of leads (e.g., leads 382, 384, 482, 484, 582, 584, FIGS. 3-5).

In block 1610, a dielectric structure (e.g., dielectric structure 170, 270, 350, 450, 550, 1050, 1150, 1250, 1350, 1450, 1550) may be placed on or affixed to the first and/or second IC die so that the dielectric structure substantially covers the portion(s) of the top surface(s) of the first and/or second IC die corresponding to the coil(s). The inductive coupling substrate may then be oriented so that the surface to which its coil(s) are proximate faces the dielectric structure. The coils of the first and/or second IC die and the inductive coupling substrate may then be aligned, and the inductive coupling substrate may be placed on or affixed to the dielectric structure. In embodiments in which the inductive coupling substrate and the second IC die are electrically coupled through corresponding contacts, the corresponding contacts also may be aligned during the attachment process, and the electrical connections between the corresponding contacts may be formed. Completion of block 1610 essentially results in the production of one of the assemblies of FIGS. 10-15.

In block 1612, the bond pads of the first and second IC die may then be wirebonded to the package leads. In block 1614, packaging of the inductive communication device may then be completed. For example, when the inductive communication device is housed within an overmolded package, a mold may be oriented around the leadframe, and non-conductive encapsulant (e.g., plastic encapsulant) may be dispensed into the mold and cured. Conversely, when the inductive communication device is housed within an air-cavity package, a cap may be attached over the top of the device to establish an air cavity within which the first and second IC are positioned.

In block 1616, the packaged inductive communication device may then be integrated into a system in which galvanic isolation between circuits is desired (e.g., system 100, 200, FIGS. 1, 2). For example, as discussed previously, embodiments of inductive communication devices described herein may be incorporated into a battery charging system for an HEV, a portion of an AC power isolation system, an isolated gate driver, or other types of system in which galvanic isolation between first and second circuits is desired.

It should be understood that the various method steps illustrated in FIG. 16 may be performed in orders other than the example order illustrated, and/or the method may include more, fewer, or different steps. In addition, certain steps may be collapsed into a single step, and other single steps may be expanded into multiple steps. In addition, certain ones of the method steps may be performed in parallel, rather than serially. Those of skill in the art would understand how to modify the illustrated flowchart in manners that produce substantially the same result. Accordingly, such modifications are intended to be included within the scope of the inventive subject matter.

An embodiment of a device includes first and second IC die, an inductive coupling substrate, and one or more dielectric components. The first IC die includes a first coil proximate to a first surface of the first IC die, and a plurality of first bond pads. The plurality of first bond pads are electrically coupled to the first coil. The inductive coupling substrate includes a second coil and a first signal communication interface. The second coil is proximate to a first surface of the inductive coupling substrate, and the second coil is electrically coupled to the first signal communication interface. The second IC die includes a second signal communication interface and a plurality of second bond pads. The second signal communication interface is electrically coupled to the plurality of second bond pads. The first IC die, the second IC die, and the inductive coupling substrate are arranged within the device so that the first surface of the inductive coupling substrate faces the first surface of the first IC die and a first surface of the second IC die, the first coil and the second coil are aligned with each other across a gap between the first IC die and the inductive coupling substrate, the first IC die and the inductive coupling substrate are galvanically isolated from each other, and the first signal communication interface and the second signal communication interface are communicably coupled. The dielectric component(s) within the gap are positioned directly between the first coil and the second coil.

An embodiment of an inductive communication method includes the step of providing a first signal to a first coil of a first IC die, where the first coil is proximate to a first surface of the first IC die, and the first coil converts the first signal into a time-varying magnetic field around the first coil. The method further includes receiving a second signal by a second coil of an inductive coupling substrate as a result of the time-varying magnetic field coupling with the second coil, where the second coil is proximate to a first surface of the inductive coupling substrate, and the second coil is electrically coupled to a first signal communication interface of the inductive coupling substrate. The method further includes communicating the second signal to a second signal communication interface of a second IC die. The first IC die, the inductive coupling substrate, and the second IC die are arranged within an integrated circuit package so that the first surface of the first IC die faces the first surface of the inductive coupling substrate, the first surface of the inductive coupling substrate faces a first surface of the second IC die, and the first coil and the second coil are aligned with each other across a gap between the first IC die and the inductive coupling substrate so that the first IC die and the inductive coupling substrate are galvanically isolated from each other.

A method of manufacturing an inductive communication device includes the step of coupling together a first IC die, an inductive coupling substrate, a second IC die, and one or more dielectric structures. The first IC die includes a first semiconductor substrate, a first coil proximate to a first surface of the first IC die, and a plurality of first bond pads. The plurality of first bond pads are electrically coupled to the first coil. The inductive coupling substrate includes a second coil and a first signal communication interface. The second coil is proximate to a first surface of the inductive coupling substrate, and the second coil is electrically coupled to the first signal communication interface. The second IC die includes a second semiconductor substrate, a second signal communication interface, and a plurality of second bond pads electrically coupled to the second signal communication interface. The first IC die, the inductive coupling substrate, and the second IC die are arranged within the device so that the first surface of the first IC die faces the first surface of the inductive coupling substrate, the first surface of the inductive coupling substrate faces a first surface of the second IC die, and the first coil and the second coil are aligned with each other across a gap between the first IC die and the and the inductive coupling substrate. The first IC die and the inductive coupling substrate are galvanically isolated from each other. The dielectric structure is positioned within the gap directly between the first coil and the second coil. The method further includes the steps of electrically connecting a plurality of first bond pads of the first IC die to first package leads, and electrically connecting a plurality of second bond pads of the second IC die to second package leads. According to further embodiments, forming the first IC die may also include forming first communication circuitry between the plurality of first bond pads and the first coil, and forming the second IC die may also include forming second communication circuitry between the plurality of second bond pads and the second signal communication interface.

While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A method of manufacturing an inductive communication device, the method comprising the steps of:
   coupling together a first integrated circuit (IC) die, an inductive coupling substrate, a second IC die, and one or more dielectric structures, wherein
   the first IC die includes a first semiconductor substrate, a first coil proximate to a first surface of the first IC die, and a plurality of first bond pads, wherein the plurality of first bond pads are electrically coupled to the first coil,
   the inductive coupling substrate includes a second coil and a first signal communication interface, wherein the second coil is proximate to a first surface of the inductive coupling substrate, and the second coil is electrically coupled to the first signal communication interface,
   the second IC die includes a second semiconductor substrate, a second signal communication interface, and a plurality of second bond pads electrically coupled to the second signal communication interface,
   the first IC die, the inductive coupling substrate, and the second IC die are arranged within the device so that the first surface of the first IC die faces the first surface of the inductive coupling substrate, the first surface of the inductive coupling substrate faces a first surface of the second IC die, and the first coil and the second coil are aligned with each other across a gap between the first IC die and the and the inductive coupling substrate, the first IC die and the inductive coupling substrate are galvanically isolated from each other, and the one or more dielectric structures are positioned within the gap directly between the first coil and the second coil.

2. The method of claim 1, further comprising:
electrically connecting the plurality of first bond pads of the first IC die to first package leads; and
electrically connecting the plurality of second bond pads of the second IC die to second package leads.

3. The method of claim 2, wherein:
electrically connecting the plurality of first bond pads of the first IC die to first package leads includes electrically connecting first wirebonds between the plurality of first bond pads and the first package leads; and
electrically connecting the plurality of second bond pads of the second IC die to second package leads includes electrically connecting second wirebonds between the plurality of second bond pads and the second package leads.

4. The method of claim 2, further comprising:
coupling a second surface of the first IC die to a support structure; and
coupling a second surface of the second IC die to the support structure, wherein the support structure and the first and second package leads form portions of a leadframe.

5. The method of claim 1, further comprising:
forming the first IC die by forming, over the first semiconductor substrate, a plurality of first patterned conductive layers, wherein the first coil is formed from multiple substantially-concentric first conductive rings of the first patterned conductive layers and first conductive vias between the first patterned conductive layers; and
forming the inductive coupling substrate die by forming a plurality of second patterned conductive layers, wherein the second coil is formed from multiple substantially-concentric second conductive rings of the second patterned conductive layers and second conductive vias between the second patterned conductive layers.

6. The method of claim 1, wherein:
the first signal communication interface of the inductive coupling substrate comprises a third coil proximate to the first surface of the inductive coupling substrate and spatially separated from the second coil;
the second signal communication interface of the second IC die comprises a fourth coil proximate to the first surface of the second IC die;
the third coil and the fourth coil are aligned with each other across a gap between the second IC die and the inductive coupling substrate;
the second IC die and the inductive coupling substrate are galvanically isolated from each other; and
the dielectric structure also is positioned directly between the third coil and the fourth coil.

7. The method of claim 6, wherein:
the third coil is formed from a plurality of third patterned conductors in a plurality of third metal layers that are separated by one or more third dielectric layers; and
the fourth coil is formed from a plurality of fourth patterned conductors in a plurality of fourth metal layers that are separated by one or more fourth dielectric layers.

8. The method of claim 1, wherein:
the first signal communication interface of the inductive coupling substrate comprises a first electrical contact proximate to the first surface of the inductive coupling substrate and spatially separated from the second coil;
the second signal communication interface of the second IC die comprises a second electrical contact proximate to the first surface of the second IC die; and
the method further comprises forming an electrical connection between the first and second electrical contacts.

9. The method of claim 1, further comprising:
forming the first IC die by forming first communication circuitry between the plurality of first bond pads and the first coil; and
forming the second IC die by forming second communication circuitry between the plurality of second bond pads and the second signal communication interface.

10. The method of claim 1, further comprising:
forming the first IC die to include first communication circuitry coupled to the first coil, wherein the first communication circuitry is selected from transmitter circuitry, receiver circuitry, and transceiver circuitry; and
forming the second IC die to include second communication circuitry coupled to the second signal communication interface, wherein the second communication circuitry is selected from transmitter circuitry, receiver circuitry, and transceiver circuitry.

11. The method of claim 1, wherein the one or more dielectric structures include one or more of:
a material selected from polyimide, polytetrafluorethylene, and benzocyclobutene; a portion of a dielectric layer overlying the first coil; a portion of a dielectric layer overlying the second coil; and an air gap.

12. The method of claim 1, wherein the one or more dielectric structures includes a dielectric material with a thickness in a range of about 25 micrometers to about 400 micrometers.

13. The method of claim 1, wherein the one or more dielectric structures include a dielectric structure having a first surface and an opposing second surface, wherein the first surface of the dielectric structure is coupled to the first surface of the first IC die, the second surface of the dielectric structure is coupled to the first surface of the inductive coupling substrate, and the dielectric structure extends beyond edges of the inductive coupling substrate.

14. The method of claim 1, wherein:
the first IC die further includes one or more additional first coils proximate to the first surface of the first IC die;
the inductive coupling substrate further includes one or more additional second coils proximate to the first surface of the inductive coupling substrate, and one or more additional first signal communication interfaces electrically coupled to the additional second coils, wherein each of the additional first coils is aligned with a corresponding one of the additional second coils across the gap;
the second IC die further includes one or more additional second signal communication interfaces electrically coupled to the plurality of second bond pads; and
the one or more dielectric structures are positioned within the gap directly between aligned pairs of the additional first coils and the additional second coils.

15. The method of claim 1, further comprising:
packaging the first IC die, the inductive coupling substrate, the second IC die, and the one or more dielectric structures together in an air-cavity package.

16. The method of claim 1, further comprising:
packaging the first IC die, the inductive coupling substrate, the second IC die, and the one or more dielectric structures together in an overmolded package.

17. An inductive communication method comprising the steps of:
providing a first signal to a first coil of a first integrated circuit (IC) die, wherein the first coil is proximate to a first surface of the first IC die, and the first coil converts the first signal into a time-varying magnetic field around the first coil;
receiving a second signal by a second coil of an inductive coupling substrate as a result of the time-varying magnetic field coupling with the second coil, wherein the second coil is proximate to a first surface of the inductive coupling substrate, and the second coil is electrically coupled to a first signal communication interface of the inductive coupling substrate; and
communicating the second signal to a second signal communication interface of a second IC die, wherein the first IC die, the inductive coupling substrate, and the second IC die are arranged within an integrated circuit package so that the first surface of the first IC die faces the first surface of the inductive coupling substrate, the first surface of the inductive coupling substrate faces a first surface of the second IC die, and the first coil and the second coil are aligned with each other across a gap between the first IC die and the inductive coupling substrate so that the first IC die and the inductive coupling substrate are galvanically isolated from each other.

18. The method of claim 17, further comprising:
receiving an input signal at a bond pad of the first IC die;
converting the input signal to the first signal by transmitter circuitry of the first IC die;
receiving the second signal by receiver circuitry of the second IC die;
producing, by the receiver circuitry, a reconstructed version of the input signal from the second signal; and
providing the reconstructed version of the input signal to a second bond pad of the second IC die.

* * * * *